(12) United States Patent
Itatani et al.

(10) Patent No.: US 7,579,276 B2
(45) Date of Patent: Aug. 25, 2009

(54) SUBSTRATE PROCESSING APPARATUS AND METHOD OF MANUFACTURING SEMICONDUCTOR DEVICE

(75) Inventors: Hideharu Itatani, Nanto (JP); Hidehiro Yanai, Toyama (JP); Sadayoshi Horii, Toyama (JP); Atsushi Sano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 66 days.

(21) Appl. No.: 11/663,179

(22) PCT Filed: Oct. 14, 2005

(86) PCT No.: PCT/JP2005/018982

§ 371 (c)(1),
(2), (4) Date: May 3, 2007

(87) PCT Pub. No.: WO2006/041169

PCT Pub. Date: Apr. 20, 2006

(65) Prior Publication Data

US 2007/0264840 A1 Nov. 15, 2007

(30) Foreign Application Priority Data

Oct. 15, 2004 (JP) .............................. 2004-302323

(51) Int. Cl.
*H01L 21/44* (2006.01)
(52) U.S. Cl. ............... 438/681; 438/785; 257/E21.477; 257/E21.586; 118/503
(58) Field of Classification Search .............. 438/681, 438/785, 788, 680; 118/729, 503; 427/255.28; 257/E21.477, E21.478, E21.586
See application file for complete search history.

(56) References Cited

U.S. PATENT DOCUMENTS

| 4,951,601 | A  | * | 8/1990  | Maydan et al. ............. 118/719 |
| 6,777,352 | B2 |   | 8/2004  | Tepman et al. |
| 2001/0042514 | A1 |   | 11/2001 | Mizuno et al. |

(Continued)

FOREIGN PATENT DOCUMENTS

JP A 2001-329370 11/2001

(Continued)

*Primary Examiner*—Caridad M Everhart
(74) *Attorney, Agent, or Firm*—Oliff & Berridge, PLC

(57) ABSTRACT

To prevent particles from generating by reducing a contact-gas area and improve a purge efficiency by reducing a flow passage capacity. There is provided a substrate processing apparatus, comprising a processing chamber 1 for processing a substrate 2; a substrate carrying port 10 provided on a sidewall of the processing chamber 1, for carrying-in/carrying-out the substrate 2 to/from the processing chamber 1; a holder provided so as to be lifted and lowered in the processing chamber 1, for holding the substrate 2; supply ports 3 and 4 provided above the holder, for supplying gas into the processing chamber 1; an exhaust duct 35 provided on the peripheral part of the holder, for exhausting the gas supplied into the processing chamber 1; and an exhaust port 5 provided below an upper surface of the exhaust duct 35 when the substrate is processed, for exhausting the gas discharged by the exhaust duct 35 outside the processing chamber 1, wherein at least a part of a member constituting the exhaust duct 35 is provided so as to be lifted and lowered.

13 Claims, 15 Drawing Sheets

U.S. PATENT DOCUMENTS

2003/0153177 A1 * 8/2003 Tepman et al. .............. 438/656

FOREIGN PATENT DOCUMENTS

| JP | A 2002-270594 | 9/2002 |
| JP | A 2003-347298 | 12/2003 |
| JP | A 2004-14952 | 1/2004 |
| JP | A 2004-158811 | 6/2004 |

* cited by examiner (a)

(b)

(a)

(b)

(a)

(b)

SUBSTRATE PROCESSING APPARATUS AND METHOD OF MANUFACTURING SEMICONDUCTOR DEVICE

TECHNICAL FIELD

The present invention relates to a substrate processing apparatus for processing a substrate, with the substrate held by a liftably moving holder, and a method of manufacturing a semiconductor device.

BACKGROUND ART

In recent years, since a semiconductor becomes finer to meet a demand for further high quality semiconductor film, a deposition process of an atomic layer level for alternately supplying two or more kinds of reactive gases is focused. As a material of such reactive gases, a reaction of a metal-containing raw material and a gas containing oxygen or nitrogen is utilized.

The deposition process can be roughly divided in two according to a reaction type. One of them is an ALD (Atomic Layer Deposition), and the other of them is a MOCVD (Metal Organic Chemical Vapor Deposition) in which a cycle-method is applied (for example see patent documents 1 and 2). The aforementioned methods have a basic gas supplying method in common, and therefore an explanation is given by using FIG. 17. FIG. 17(a) is a flowchart, and FIG. 17(b) is a gas supplying timing diagram. In an example shown in the figure, a vaporized metal containing raw material is represented by a raw material A, and the gas containing oxygen or nitrogen is represented by a raw material B.

In a case of the ALD, in step 1, the raw material A is supplied to a substrate and adsorbed on the substrate. In step 2, a residual raw material A is exhausted. In step 3, the raw material B is supplied to the substrate, and the raw material B is allowed to react with the raw material A, to perform deposition. In step 4, the residual raw material B is exhausted. The ALD method is the method of repeatedly perform cycles more than once, with the aforementioned four steps set as one cycle. As is shown in the gas supplying timing of FIG. 17(b), when the raw material A and the raw material B are alternately supplied, exhaustion by purge gas is executed.

In the MOCVD, in which the cycle method is applied, in step 1, the raw material A is supplied to the substrate, which is then thermally decomposed, to perform deposition. In step 2, the residual raw material A is exhausted. In step 3, the raw material B is supplied to the substrate and a film modifying process for a deposited film is performed. In step 4, the residual raw material B is exhausted. The MOCVD method, in which the cycle method is applied, is the method of repeatedly perform cycles more than once, with the aforementioned four steps set as one cycle. As is shown in the gas supplying timing of FIG. 17(b), when the raw material A and the raw material B are alternately supplied, exhaustion by purge gas is executed.

Generally, the raw material A and the raw material B have extremely high reactivity in many cases, and when these raw materials are simultaneously supplied, a foreign matter is generated by vapor-phase reaction and a deposition of a film with deteriorated film quality is generated, thus causing a decline in yield ratio. Therefore, in the aforementioned steps 2 and 4, purge (exhaustion) by evacuation and inert gas is executed, so that the gaseous starting material supplied in the aforementioned previous steps 2 and 4 does not remain. Particularly, a residual gas on the upstream side of the substrate immediately affects a deposition condition of the substrate, and therefore a sufficient exhaustion is required.

However, if it takes long time for exhaustion, although the sufficient exhaustion is enabled, there is a problem that a throughput in productivity is deteriorated.

Also, in a case of the ALD, there is a possibility that a film is deposited all over the area where the raw material in a processing chamber is adsorbed, thus producing particles. Therefore, a contact-gas area of the gaseous starting material is required to be made small as much as possible. Simultaneously, in order to shorten a substitution time of two or more kinds of the starting gases, a flow passage capacity of the gaseous starting material is also required to be made small as much as possible.

Also, a single wafer type apparatus for processing substrates sheet by sheet becomes a main stream as a semiconductor manufacturing device for executing the aforementioned deposition method. In order to form a high quality film with high productivity by using the single wafer type apparatus, gas supply and an exhaustion method are important, from the viewpoint of the aforementioned particles and throughput.

Patent document 1: Japanese Patent Laid Open No. 2003-347298

Patent document 2: Japanese Patent Laid Open No. 2004-158811

DISCLOSURE OF THE INVENTION

Problem to be Solved by the Invention

Generally, the single wafer type apparatus is provided with a holder (susceptor) for holding the substrate and a lifting/lowering mechanism whereby this holder is liftably moved. A transfer chamber provided with a transfer robot is connected to a processing chamber provided with this holder. During carry-in and carry-out of the substrate, the substrate is carried in the processing chamber from the transfer chamber by the transfer robot in a lower part of the processing chamber by lowering the holder thereto, or the substrate is carried out from the processing chamber to the transfer chamber.

During processing the substrate, the processing chamber is shut off from the transfer chamber, and the holder is lifted when the substrate is processed in an upper part of the processing chamber. Therefore, a driving part of the holder is provided in the lower part of the processing chamber, and a carrying port of the substrate is provided on the sidewall of the processing chamber. A gate valve for shutting off the processing chamber from the transfer chamber is provided in this carrying port.

In a conventional single wafer type apparatus, when a processing gas is supplied during processing the substrate, gas is supplied not only to the substrate in the upper part of the processing chamber but also to a space (in the lower part of the processing chamber) formed on the backside of the holder by lifting of the holder. Therefore, a film is unavoidably deposited on a bottom part of the processing chamber and the driving part, the carrying port, and the gate valve, etc. It is difficult to remove the film by gas cleaning, thus deposited on the lower part of the processing chamber and driving part hidden on the backside of the holder, or the carrying port, and the gate valve, etc. Accordingly, when the processing gas flows in the lower part of the processing chamber which is lower than the holder and the film is deposited on the bottom part of the processing chamber, the carrying port, and the gate valve, etc, the particles are produced by the peeling of a deposited film when the driving part is actuated, and the yield ratio of the semiconductor would be deteriorated. Particularly, in a case of the ALD, a part of adsorption is not limited to a high temperature part, but ranges over the whole area, and therefore it appears that a large problem is thereby caused.

In addition, in a case of the single wafer type apparatus, time required for each step largely affects the productivity of the device when the MOCVD, in which the ALD and the cycle method are applied, is adopted. Therefore, there is a desire to shorten the time required for each step. In order to respond to this desire, it is necessary to efficiently supply the processing gas on the substrate and efficiently purge the residual gas. Accordingly, it is important to make the contact-gas area in the processing chamber and the flow passage capacity small as much as possible. However, in the conventional single wafer type apparatus, when the processing gas is supplied or the residual gas is purged, the processing gas and the purge gas unexpectedly flow not only to the upper part of the processing chamber, but also to the space (lower part of the processing chamber) formed on the backside of the holder by the lift of the holder. Therefore, the flow passage capacity becomes large in the processing chamber, thus making it difficult to shorten the substitution time of the two or more kinds of gaseous starting materials. Therefore, it is not easy to improve the throughput.

In order to solve the above-described problems, an object of the present invention is to provide the substrate processing apparatus capable of preventing the particles from being produced and improving the throughput by reducing the contact-gas area in the processing chamber and the flow passage capacity, and a method of manufacturing the semiconductor device.

Means to Solve the Problems

A first invention provides a substrate processing apparatus, including:

a processing chamber for processing a substrate;

a substrate carrying port provided on a sidewall of the processing chamber, for carrying-in/carrying-out the substrate to/from the processing chamber;

a holder provided so as to be lifted and lowered in the processing chamber, for holding the substrate;

a supply port provided above the holder, for supplying gas into the processing chamber;

an exhaust duct provided on the peripheral part of the holder, for exhausting the gas supplied to the processing chamber; and an exhaust port provided below an upper surface of the exhaust duct when the substrate is processed, for exhausting the gas discharged by the exhaust duct outside the processing chamber, wherein at least a part of a member constituting the exhaust duct is provided so as to be lifted and lowered.

In the aforementioned structure, when the substrate is carried in the processing chamber, by lifting the holder, the substrate carried in the processing chamber is placed on the holder. When the holder is lifted, at least a part of the member constituting the exhaust duct is accordingly lifted. The substrate is processed by exhausting the gas by the exhaust duct provided on the peripheral part of the holder, while supplying the gas to the substrate placed on the holder. The gas exhausted by the exhaust duct is exhausted outside the processing chamber by the exhaust port provided below the upper surface of the exhaust duct. After processing the substrate, by lowering the holder, the substrate after processing is set in a state possible to be carried out. When the holder is lowered, at least a part of the member constituting the exhaust duct is accordingly lowered. The substrate after processing is carried out of the processing chamber.

According to the present invention, by providing the exhaust duct on the peripheral part of the holder, for exhausting the gas supplied to the processing chamber, the gas supplied to the upper part of the processing chamber above the holder is discharged from the peripheral part of the holder to the exhaust port through the exhaust duct. Accordingly, turn-around of the gas to the lower part of the processing chamber below the holder can be prevented. In addition, at least a part of the member constituting the exhaust duct is liftably constituted, and when the substrate is processed, the holder is lifted and a part of the exhaust duct is also lifted accordingly. Therefore, the contact-gas area and the gas flow passage capacity can be reduced.

A second invention provides the substrate processing apparatus according to the first invention, wherein at least a part of the member constituting the exhaust duct is linked with the holder and is lifted together with the holder. In a structure that at least a part of the member constituting the exhaust duct is linked with the holder and is lifted together with the holder, when the substrate is processed and the holder is lifted, a part of the exhaust duct is also lifted together with the holder. Therefore, the contact-gas area and the gas flow passage capacity can be reduced.

Also, a part of the exhaust duct is linked and lifted with a movement of the holder, and therefore when the holder is lifted, a part of the exhaust duct is also lifted accordingly. Therefore, it is not necessary to lift a part of the exhaust duct separately independently. In addition, a lifting means for lifting a part of the exhaust duct is not required.

A third invention provides the substrate processing apparatus according to the first invention, wherein at least a part of the member constituting the exhaust duct is placed on the holder, and is lifted together with the holder.

When at least a part of the member constituting the exhaust duct is placed on the holder and is lifted together with the holder, a part of the exhaust duct is also lifted together with the holder in a state of being placed on the holder when the substrate is processed and the holder is lifted. Therefore, the contact-gas area and the gas flow passage capacity can be reduced.

Also, since a part of the exhaust duct is linked and lifted with the movement of the holder, by lifting the holder, a part of the exhaust duct is also automatically lifted along with the lift of the holder. Therefore, a part of the exhaust duct is not required to be lifted separately and independently. In addition, a lifting means for lifting a part of the exhaust duct is not required.

A fourth invention provides the substrate processing apparatus according to the first invention, wherein at least a part of the member constituting the exhaust duct is disposed at a position not facing with a substrate carrying port when the substrate is carried-in/carried-out, and is disposed at a position facing with at least a part of the carrying port when the substrate is processed. Here, as the position not facing with the substrate carrying port, the position lower than the substrate carrying port is given as an example. Also, as the position facing at least a part of the substrate carrying port, a position, where at least a part of the substrate carrying port is shut, can be given as an example.

In case that the exhaust duct is fixed to a substrate processing position, when the substrate is carried-in and carried-out, in order to enable the substrate to be carried in the processing chamber, it is necessary to dispose the substrate carrying port below the exhaust duct, so that the exhaust duct and the substrate carrying port are not overlapped one another. However, the processing chamber is thereby made higher.

In this point, according to the substrate processing apparatus of the present invention, a part of the exhaust duct is liftably moved, and when the substrate is processed, a part of the exhaust duct is disposed at a position facing with (overlapping on) a part of the substrate carrying port. Therefore, the processing chamber can be made lower by an overlapped portion of a part of the exhaust duct and a part of the substrate carrying port, and a capacity of an entire body of the processing chamber can be made smaller. Then, a flow passage to the substrate carrying port is closed by the overlapped portion, and the contact-gas area and the flow passage capacity can be reduced.

In addition, when the substrate is carried-in and carried-out, a part of the liftably moving exhaust duct is disposed at a position not facing with (overlapping on) the substrate carrying port, and therefore the substrate is not inhibited from carrying in/out of the processing chamber from the substrate carrying port.

A fifth invention provides the substrate processing apparatus according to the first invention, wherein the exhaust duct is provided on the side of the holder.

Since the exhaust duct is provided on the side of the holder, the gas supplied to the processing chamber can be exhausted to the exhaust port from the side of the holder through the exhaust duct. Therefore, turn-around of the gas to the lower part of the processing chamber below the holder can be prevented, and the contact-gas area and the flow passage capacity can be reduced. In addition, when the exhaust duct is provided on the side of the holder, the capacity of the upper part of the processing chamber to which the gas is supplied when the substrate is processed is made smaller, compared to a case that the exhaust duct is provided below the holder. Therefore, the flow passage capacity of the gas can be made smaller, and the contact-gas area can also be made smaller.

A sixth invention provides the substrate processing apparatus according to the first invention, wherein the exhaust duct is provided so as to close a gap between a sidewall of the processing chamber and a sidewall of the holder.

By providing the exhaust duct so as to close the gap between the processing chamber sidewall and the holder sidewall, the turn-around of the gas to the backside of the holder, passing through the gap between the processing chamber sidewall and the holder sidewall can be prevented, and the contact-gas area and the flow passage capacity can be reduced.

A seventh invention provides the substrate processing apparatus according to the first invention, wherein the exhaust duct is constituted by a plate having a hollow part that communicates with the processing chamber, and is placed on the holder so that a part of the plate covers at least a part of an upper surface of the holder.

Since the hollow part of the plate is communicated with the processing chamber, the gas supplied to the processing chamber by this hollow part can be exhausted. Also, since the substrate processing chamber is placed on the holder, so that a part of the plate covers at least a part of the upper surface of the holder, the gap can be closed, which is formed between the holder and the plate when the plate is not placed on the holder so as to cover the upper surface of the holder. Therefore, the turn-around of the gas to the backside of the holder from between the holder sidewall and the plate can be prevented, and the contact-gas area and the flow passage capacity can be reduced.

An eighth invention provides the substrate processing apparatus according to the seventh invention, wherein the hollow part is provided between a processing chamber sidewall and a holder sidewall.

Since the hollow part is provided between the processing chamber sidewall and the holder sidewall, the gas supplied to the processing chamber can be exhausted to the exhaust port from between the processing chamber sidewall and the holder sidewall through the hollow part, the turn-around of the gas to the lower part of the processing chamber below the holder can be prevented, and the contact-gas area and the flow passage capacity can be reduced. In addition by providing the hollow part between the processing chamber sidewall and the holder sidewall, the capacity of the upper part of the processing chamber to which the gas supplied when the substrate is processed can be made smaller, compared to a case that the hollow part is provided below the holder. Therefore, the flow passage capacity of the gas can be made smaller, and the contact-gas area can also be made smaller.

A ninth invention provides the substrate processing apparatus according to the first invention, wherein the exhaust duct is constituted by a plate having a hollow part that communicates with the processing chamber, and the plate is composed of a first plate having a recessed part and a second plate covering the recessed part, and they are separately provided.

Since the plate is composed of the first plate having the recessed part and the second plate covering the recessed part, and they are separately provided, the hollow part can be formed when the second plate covers the recessed part of the first plate when the substrate is processed. In addition, since the hollow part thus formed is communicated with the processing chamber, the gas supplied to the processing chamber can be exhausted by this hollow part, and the contact-gas area and the flow passage capacity can be reduced.

A tenth invention provides the substrate processing apparatus according to the ninth invention, wherein the first plate is provided so as to be lifted and lowered, and the second plate is held at a substrate processing position.

Since the first plate is liftably provided, and the second plate is held at the substrate processing position, when the substrate is processed, by lifting the first plate to the substrate processing position, the hollow part can be formed by covering the recessed part of the first plate by the second plate, and when the substrate is carried-in and carried-out, by lowering the first plate to a substrate carry-in/carry-out position, they can be separated.

An eleventh invention provides the substrate processing apparatus according to the tenth invention, wherein the second plate has an inside plate and an outside plate, and the inside plate is placed on the outside plate.

Since the second plate has the inside plate and the outside plate and the inside plate is placed on the outside plate, only the inside plate can be moved without moving the outside plate by lifting and lowering the first plate.

A twelfth invention provides the substrate processing apparatus according to the eleventh invention, wherein only the inside plate is brought into contact with the first plate in a state of moving the substrate to the substrate processing position, and the outside plate is not brought into contact with the first plate.

Since only the inside plate is brought into contact with the first plate in a state of moving the substrate to the substrate processing position and the outside plate is not brought into contact with the first plate, the inside plate placed on the outside plate can be lifted by moving the substrate to the substrate processing position.

A thirteenth invention provides the substrate processing apparatus according to the twelfth invention, wherein the discharge port for discharging the gas into a hollow part of the plate from the processing chamber is formed by the gap between the inside plate and the outside plate in a state of moving the substrate to the substrate processing position.

By a simple structure that the substrate is moved to the substrate processing position, the discharge port for discharging the gas into the hollow part of the plate from the processing chamber can be formed by the gap between the inside plate and the outside plate.

A fourteenth invention provides the substrate processing apparatus according to the first invention, further having a controller for controlling to supply two kinds or more of reactive gases alternately for a plurality of times from the supply port, and interpose a supply of purge gas between alternate supplies of the two kinds of more of the reactive gases.

When a cyclic processing is performed such as alternately supplying two kinds of more of the reactive gases for a plurality of times, with supply of the purge gas interposed therebetween, turn-around of the gas to the lower part of the processing chamber below the holder can be prevented. Therefore, the contact-gas area and the gas flow passage capacity can be made small as much as possible, the reactive gas can be supplied for a short time, and the residual gas can be purged.

A fifteenth invention provides a method of manufacturing a semiconductor device, including:

carrying a substrate into a processing chamber;

placing the substrate carried into the processing chamber on a holder by lifting the holder;

processing the substrate by discharging gas by an exhaust duct provided on the peripheral part of the holder while supplying the gas to the substrate placed on the holder, and exhausting the gas outside the processing chamber from an exhaust port provided below an upper surface of the exhaust duct;

setting the substrate after processing possible to be carried out by lowering the holder; and carrying out the substrate after processing from the processing chamber, wherein in the step of lifting and lowering the holder, at least a part of a member constituting the exhaust duct is lifted and lowered together with the holder.

According to the present invention, the gas is exhausted by the exhaust duct provided on the peripheral part of the holder, and the gas thus exhausted by the exhaust duct is exhausted outside the processing chamber by the exhaust port provided below the upper surface of the exhaust duct. Therefore, the turn-around of the gas to the lower part of the processing chamber below the holder can be prevented. In addition, at least a part of the member constituting the exhaust duct is lifted and lowered together with the holder. Therefore, the substrate is not inhibited from carrying in/out the processing chamber from the substrate carrying port. Further, at least a part of the member constituting the exhaust duct is liftably constituted, and when the substrate is processed and the holder is lifted, a part of the exhaust duct is also lifted. Therefore, the contact-gas area and the gas flow passage capacity can be reduced.

A sixteenth invention provides the method of manufacturing the semiconductor device according to the fifteenth invention, wherein in the step of processing the substrate, two kinds or more of reactive gases are alternately provided to the substrate for a plurality of times, and supply of purge gas is interposed between the alternate supply of the two kinds or more of the reactive gases.

When a sequential process is thus performed, high purge efficiency is required. However, even when such a process is performed, the turn-around of the gas to the lower part of the processing chamber below the holder can be prevented, and the contact-gas area and the gas flow passage capacity can be reduced as much as possible. Therefore, supply of the reactive gas and the purge of the residual gas are possible for a short time.

A seventeenth invention provides the method of manufacturing the semiconductor device according to the fifteenth invention, wherein the step of processing the substrate includes the steps of:

adsorbing at least one kind of reactive gas on the substrate; and promoting a film deposition reaction by supplying reactive gas to the adsorbed reactive gas different from this reactive gas.

When the sequential process is thus performed, high purge efficiency is required, but even when such a sequential process is performed, the turn-around of the gas to the lower part of the processing chamber below the holder can be prevented, and the contact-gas area and the gas flow passage capacity can be made small as much as possible. Therefore, the supply of the reactive gas and the purge of the residual gas are enabled in a short time.

In addition, particularly in a case of the ALD, there is a possibility that the film is deposited over an entire place where the raw material in the processing chamber is adsorbed, thus causing particles. Therefore, the contact-gas area of the gaseous raw material is required to be made small as much as possible, and simultaneously the flow passage capacity of the gaseous raw material is also required to be made small as much as possible to shorten the substitution time of two or more kinds of the gaseous raw materials, and this can also be solved.

An eighteenth invention provides the method of manufacturing the semiconductor device according to the fifteenth invention, wherein the step of processing the substrate repeats for a plurality of times the steps of:

supplying a first reactive gas to the substrate and adsorbing it on the substrate;

purging it thereafter;

supplying a second reactive gas to the first reactive gas adsorbed on the substrate, and promoting a film deposition reaction thereafter; and purging it thereafter.

When the sequential process is thus performed, the high purge efficiency is required. However, even when such a process is performed, the turn-around of the gas to the lower part of the processing chamber below the holder can be prevented, and the contact-gas area and the gas flow passage capacity can be made small as much as possible. Therefore, the supply of the reactive gas and the purge of the residual gas are enabled for a short time.

In addition, particularly in the case of the ALD, there is a possibility that the film is deposited over an entire place where the raw material in the processing chamber is adsorbed, thus causing particles. Therefore, the contact-gas area of the gaseous raw material is required to be made small as much as possible, and simultaneously the flow passage of the starting gas is also required to be made small as much as possible to shorten the substitution time of the two or more kinds of gaseous raw materials, and this can also be solved.

A nineteenth invention provides the method of manufacturing the semiconductor device according to the fifteenth invention, wherein the step of processing the substrate includes the steps of:

decomposing at least one kind of reactive gas and depositing it on a substrate; and supplying reactive gas different from the aforementioned reactive gas to the thin film thus deposited and modifying the thin film.

When the sequential process is thus performed, high purge efficiency is required. However, even when such a process is performed, the turn-around of the gas to the lower part of the processing chamber below the holder can be prevented, and the contact-gas area and the gas flow passage capacity can be made small as much as possible. Therefore, the supply of the reactive gas and the purge of the residual gas are enabled in a short time.

A twentieth invention provides the method of manufacturing the semiconductor device according to the fifteenth invention, wherein the step of processing the substrate repeats for a plurality of times the steps of:

supplying a first reactive gas to a substrate and depositing a thin film on the substrate;

purging it thereafter;

supplying a second reactive gas to the thin film deposited on the substrate and modifying the thin film thereafter; and purging it thereafter.

When the sequential process is thus performed, high purge efficiency is required. However, even when such a process is performed, the turn-around of the gas to the lower part of the processing chamber below the holder can be prevented, and the contact-gas area and the gas flow passage capacity can be made small as much as possible. Therefore, the supply of the reactive gas and the purge of the residual gas are enabled in a short time.

ADVANTAGE OF THE INVENTION

According to the present invention, by reducing the contact-gas area in the processing chamber and the flow passage capacity, particles are prevented from being produced, and the throughput can be improved. Accordingly, a high quality film with high productivity can be formed.

BEST MODE FOR CARRYING OUT THE INVENTION

A process form, to which the present invention is applied, will be explained hereunder with reference to the drawings. An explanation is given here, with an ALD process given as an example, wherein a gas which has been gasified from Ru(EtCp)$_2$(bisethylcyclopentadienylruthenium), being a metal containing raw material, is used as a first reactive gas, and oxygen containing oxygen or nitrogen is used as a second reactive gas, and a film deposition of a ruthenium film, being a metal film, is performed.

FIG. 1 and FIG. 2 are sectional views for explaining a single wafer type substrate processing apparatus according to a first embodiment. FIG. 1 is a vertical sectional view when a substrate is carried out and carried in, and FIG. 2 is a vertical sectional view when the substrate is processed.

As shown in FIG. 1, the substrate processing apparatus includes a processing chamber 1 for processing a substrate 2; a substrate carrying port 10 provided on the sidewall 40 of the processing chamber 1, for carrying in and carrying out the substrate 2; and a susceptor 6 as a holder liftably provided in the processing chamber 1, for holding the substrate 2. Also, included are supply ports 3 and 4 provided above the susceptor 6 for supplying gas into the processing chamber 1, and an exhaust duct 35 provided on the peripheral part of the susceptor 6 for discharging the gas supplied into the processing chamber 1. Further, included is an exhaust port 5 for exhausting the gas discharged by the exhaust duct 35 to the outside the processing chamber 1.

The processing chamber 1 is flatly constructed by an upper container 46 and a lower container 47 which are circular in section. This processing chamber 1 is constructed to process the substrate 2 such as one sheet of silicon substrate (silicon wafer) by a sealed flat inner space. The upper container 46 and the lower container 47 are constructed by aluminum and stainless, for example.

The substrate carrying port 10 is provided on one sidewall of the lower container 47. A transfer chamber 9a is provided in an opening of an extension part extended outside from this substrate carrying port 10 through a gate valve 11. A transfer robot 45 as a carrying means is provided in the transfer chamber 9a. By this transfer robot 45, the substrate 2 can be carried from the transfer chamber 9a to the processing chamber 1 or from the processing chamber 1 to the transfer chamber 9a through the substrate carrying port 10, with the gate valve 11 opened. Note that purge gas can be supplied into the substrate carrying port 10 through a valve 19. Inert gas such as Ar, N$_2$, He can be given as the purge gas.

A susceptor 6, being discoidal, is provided in the processing chamber 1, and the substrate 2 is held thereon in an almost horizontal state. The susceptor 6 has a heater 6a built therein such as a ceramics heater controlled by a temperature controller 21, and the substrate 2 is heated to a specified temperature. Also, the susceptor 6 is constructed so as to support the exhaust duct 35 on the peripheral part of the substrate 2 held by the susceptor 6. The susceptor 6 has a support shaft 59. The support shaft 59 is inserted in a vertical direction from a thorough hole 58 provided in a bottom center of the lower container 47 of the processing chamber 1, so that the susceptor 6 can be vertically moved by a lifting/lowering mechanism 9. The substrate 2 is carried at a substrate carrying position (position shown in FIG. 1) where the susceptor 6 is in a lower part, and a film deposition processing is performed at a substrate processing position (position shown in FIG. 2) where the susceptor is in an upper part. When the susceptor 6 supporting the exhaust duct 35 is located at the aforementioned substrate processing position, a processing chamber upper part 1a above the exhaust duct 35 and a processing chamber lower part 1b below the exhaust duct 35 are vertically formed in the processing chamber 1, by the exhaust duct 35 and the susceptor 6 whereby inside of the processing chamber 1 is vertically partitioned. Note that the purge gas can be supplied to the through hole 58 via the valve 18. The inert gas such as Ar, N$_2$, and He can be given as the inert gas. The susceptor is constituted of quartz, carbon, ceramics, silicon carbide (SiC), aluminum oxide (Al$_2$O$_3$), or aluminum nitride (AlN), for example.

The gas supply ports 3 and 4 are provided in the upper container 46 and therefore are provided above the susceptor 6. A shower plate 8a having a plurality of holes is provided in the center of the upper container 46 that faces the susceptor 6, and the gas supply ports 3 and 4 are positioned in the upper part of this shower plate 8a. The gas supply ports 3 and 4 are adjacently provided. The gas supplied from the gas supply ports 3 and 4 is supplied to a space above the shower plate 8a, and is supplied on the substrate 2 in a state of a shower from a plurality of holes of the shower plate 8a, then flows on the substrate 2 in a diameter direction of the substrate, and is exhausted toward the exhaust port 5 from the peripheral part of the substrate 2 through the exhaust duct 35 as will be described later (flowing type in the diameter direction). Here, the flowing type in the diameter direction refers to a type of supplying the gas in a vertical direction to a substrate surface from the gas supply port provided in the upper part of the substrate, allowing the gas to flow on the substrate in the diameter direction of the substrate, and exhausting the gas from the peripheral part of the substrate toward the exhaust port.

Lines of two systems for supplying the gas are connected to the gas supply ports 3 and 4. A line connected to a gas supply port 3, which is one of them, is the line for supplying the first reactive gas, namely, a Ru(EtCp)$_2$ supply line 14 for supplying Ru(EtCp)$_2$(bisethylcyclopentadienylruthenium), being an organic liquid raw material used in depositing a metal film such as a ruthenium film. Note that as described later, the Ru(EtCp)$_2$ supply line 14 selectively supplies the first reactive gas or the purge gas into the upper part of the processing chamber 1a from the gas supply port 3.

Another line connected to other gas supply port 4 is a line for supplying a second reactive gas, namely an oxygen supply line 15 for supplying a gas containing oxygen or nitrogen, being a gas with high reactivity to the organic liquid raw material, such as oxygen. Note that as described later, the oxygen supply line 15 selectively supplies the second reactive gas or the purge gas into the upper part of the processing chamber 1a from the gas supply port 4.

The Ru(EtCp)$_2$ supply line 14 is provided with a liquid flow late control device 23 for controlling a flow rate of Ru(EtCp)$_2$, being the liquid raw material, in a liquid state; a vaporizer 25 for vaporizing the Ru(EtCp)$_2$ liquid whose flow rate is controlled; and a valve 12 for stopping the supply of vaporized Ru(EtCp)$_2$ to the line 14. An Ar supply line 57 is connected on the downstream side of the valve 12 of this Ru(EtCp)$_2$ supply line 14, and an Ar gas whose flow rate is controlled by a flow rate control device 22 can be supplied to the Ru(EtCp)$_2$ supply line 14 through a valve 16.

Note that instead of Ar, the inert gas such as N$_2$ and He may be supplied from the Ar supply line 57.

The above-described structure allows the following three options to be taken for introducing the gas to the supply port 3.

(1) By opening the valve 12 of the Ru(EtCp)$_2$ supply line 14 and closing the valve 16 of the Ar supply line 57, only Ru(EtCp)$_2$ gas vaporized by the vaporizer 25 is independently introduced to the supply port 3 from the Ru(EtCp)$_2$ supply line 14.

(2) Further, by opening the valve 16 of the Ar supply line 57, mixed gas of the Ru(EtCp)$_2$ gas and Ar gas is introduced to the supply port 3 from the Ru(EtCp)$_2$ supply line 14.

(3) By stopping the supply of the Ru(EtCp)$_2$ gas from the vaporizer 25, only the Ar gas is independently introduced to the supply port 3 from the Ru(EtCp)$_2$ supply line 14.

The oxygen supply line 15 is provided with a flow rate control device 24 for controlling the flow rate of oxygen; a remote plasma unit 33 for activating the oxygen whose flow rate is controlled; and the valve 13 for stopping the supply of the activated oxygen to the line 15. The aforementioned Ar supply line 57 is branched by a branch line 57a and connected on the downstream side of the valve 13 of this oxygen supply line 15, so that the Ar gas whose flow rate is controlled by the flow rate control device 22 can be supplied to the oxygen supply line 15 through a valve 17.

The above-described structure allows the following three options to be taken for introducing the gas to the supply port 4.

(1) By opening the valve 13 of the oxygen supply line 15 and by closing the valve 17 of the branch line, only the oxygen (referred to as activated oxygen hereafter) activated by the remote plasma unit 33 is independently introduced to the supply port 4.

(2) Further, by opening the valve 17 of the branch line 57a, the mixed gas of the activated oxygen and the Ar gas is introduced to the supply port 4 from the oxygen supply line 15.

(3) By stopping the supply of the activated oxygen from the remote plasma unit 33, only the Ar gas is independently introduced to the supply port 4 from the oxygen supply line 15.

The exhaust duct 35 is provided on the peripheral part of the susceptor 6, and when the substrate is processed, the gas supplied into the upper part of the processing chamber 1a above the susceptor is discharged from the peripheral part of the susceptor. Whereby the gas is exhausted to the outside the processing chamber 1, without being flown to the lower part 1b of the processing chamber (see FIG. 2). This exhaust duct 35 is constructed by a plate 7 having a hollow part (plate buffer) 27 that communicates with the upper part 1 of the processing chamber. The plate 7 has a discharge port 26 and a plate exhaust port 28, and the gas supplied into the upper part 1a of the processing chamber is discharged into the hollow part 27 from the discharge port 26, and the gas thus discharged into the hollow part 27 is exhausted from the plate exhaust port 28.

A part of the plate 7 is placed on the susceptor 6, so as to cover at least a part of the upper surface of the susceptor 6. Thus, the exhaust duct 35 constructed by the plate 7 is linked with a movement of the susceptor 6 and is lifted and lowered together with the susceptor 6. In addition, since a part of the plate 7 covers at least a part of the upper surface of the susceptor 6, deposition of the film on a part thus covered can be prevented, and a gap between the susceptor 6 and the plate 7 formed when the plate 7 is not placed on the susceptor 6 to cover the upper surface of the susceptor 6 can be closed, and turn-around of the gas to the backside of the susceptor 6 from between the sidewall of the susceptor 6 and the plate 7 can be prevented.

The exhaust duct 35 (hollow part 27) is disposed at a position not facing the substrate carrying port 10, for example, below the substrate carrying port 10 (see FIG. 1). Also, when the substrate is processed, the exhaust duct 35 is disposed at a position facing a part (upper part) of the substrate carrying port 10, namely, at a position closing at least a part of the substrate carrying port 10 (see FIG. 2). Further, when the substrate is processed, the exhaust duct 35 is provided so as to close the gap between the sidewall 40 of the processing chamber and the sidewall 60 of the susceptor. When the substrate is carried in and out, the exhaust duct 35 is disposed below the substrate carrying port 10 so that the exhaust duct does not cause obstruction for carrying in and out the substrate. Also, when the substrate is processed, the exhaust duct 35 is disposed at a position closing at least a part of the substrate carrying port 10 to make the capacity of an entire body of the processing chamber small by overlapping a part of the exhaust duct 35 on the substrate carrying port 10 and decreasing the height of the processing chamber by this overlapped portion, and also to reduce a contact-gas area by closing the substrate carrying port 10 and preventing the turn-around of the gas. Also, when the substrate is processed, the exhaust duct 35 is provided so as to close the gap between the sidewall 40 of the processing chamber and the sidewall 60 of the susceptor, in order to prevent the gas from flowing to the lower part 1b of the processing chamber from the upper part 1*a* of the processing chamber by interrupting the flow passage to the lower part 1*b* of the processing chamber.

The exhaust duct will be explained in detail by using FIG. 3 and FIG. 4. FIG. 3 is a projection view and a sectional view of the plate 7, (a) is a plan view, (b) is a side view, (c) is a front view, (d) is a sectional view taken along the line A-A, (e) is a sectional view taken along the line B-B, and FIG. 4 is a partially broken perspective view of the plate 7.

The plate 7 constituting the exhaust duct 35 has a shape of a flat annular body as a whole, and is provided on the peripheral part of a flat discoidal susceptor 6. The hollow part 27 of the plate 7 is annularly provided below the upper surface of a part placed on the susceptor 6 of the plate 7 and at a sidewall peripheral position of the susceptor 6, so as to surround the susceptor 6 (see FIG. 4).

The plate 7 having the hollow part 27 is constructed by a first plate 37 and a second plate 36, and they are integrally formed. The first plate 37 has an annular recessed part 37*a* with an upper part opened. The recessed part 37*a* forms an exhaust passage for introducing to the exhaust port 5 the gas supplied into the upper part 1*a* of the processing chamber when the substrate is processed. The second plate 36 is formed of a ring plate whereby a part of the opening of the recessed part 37*a* of the first plate 37 is covered and the hollow part 27 is formed, and the substrate placed on the susceptor 6 is fit into a hole 34 of the center.

Note that the second plate 36 is provided around the substrate 2, and controls a gas flow flowing onto the substrate 2. Here, the plate 7 is supported on the peripheral part of the susceptor 6 in such a way as overhung over the sidewall 40 of the processing chamber from the susceptor 6. In addition, the plate 7 is provided so that its surface is flush with the surface of the substrate 2. Thus, the second plate 36 has also a function as a rectifying plate capable of parallely and uniformly supplying the reactive gas or the purge gas (referred to as simply gas in some cases) onto the surface of the substrate.

A plate, whose outer diameter is slightly smaller than a diameter of an outer sidewall (inner wall face) of the recessed part 37*a* of the first plate 37, and whose inner diameter is smaller than a diameter of an inner sidewall of the recessed part 37*a*, is used for the second plate 36. This second plate 36 is concentrically placed on the first plate 37. By this structure, the second plate 36 is not completely overlapped on an opening upper part of the recessed part 37*a* of the first plate 37 (partially overlapped), and the second plate 36 has an appearance of being deviated inwardly in a diameter direction with respect to the opening upper part of the recessed part 37*a* of the first plate 37. Accordingly, the second plate 36 is placed only on an upper side of the inner sidewall of the recessed part 37*a* of the first plate 37. Note that an outer peripheral part of the second plate 36 is called a plate outside part 36*a* and an inner peripheral part of the second plate 36 is called a plate inside part 36*b*, with a part placed on an upper side of the inner sidewall of the recessed part 37*a* as a border. As described above, by the deviation of the second plate 36 with respect to the opening upper part of the recessed part 37*a*, an annular gap is formed on the upper side of the outer peripheral sidewall of the hollow part 27 formed by being covered by the plate outside part 36*a* of the second plate 36, and this annular gap becomes an annular discharge port 26 formed on the upper surface of the plate 7 (see FIGS. 3(*a*) and (*e*)). In addition, the plate inside part 36*b* of the second plate 36 swelling inward from the inner sidewall of the recessed part 37*a* becomes a part of the plate 7 placed on the outer peripheral upper surface of the susceptor 6.

Note that the discharge port 26 has not only the function of discharging into the hollow part 27 the gas supplied into the upper part 1*a* of the processing chamber, but also the function of adjusting conductance for equalizing a gas flow onto the silicon substrate 2. Namely, the discharge port 26 controls a gas quantity discharged into the hollow part 27 of the plate 7 through this discharge port 26, from the upper part 1*a* of the processing chamber above the plate 7, and controls a gas pressure of the gas supplied onto the substrate 2, thereby equalizing a pressure distribution on the substrate 2. The discharge conductance of this discharge port 26 can be adjusted by deflecting the position of the second plate 36 and changing a shape of the plate outside part 36*a* of the second plate 36.

The plate exhaust port 28 is provided on the outer sidewall of the first plate 37. This plate exhaust port 28 is formed into a circular shape, below the discharge port 26 and at a part facing the exhaust port 5, namely at a lower outer sidewall of the first plate 37, out of the whole peripheral part of the outer sidewall of the first plate 37, so that the gas discharged into the hollow part 27 from the discharge port 26 is exhausted to the exhaust port 5 (see FIGS. 3(*b*) and (*d*)). Note that the aforementioned plate 7 is constituted of quartz and ceramics series (AlN, Al$_2$O$_3$, SiC), etc, for example.

The exhaust port 5 for exhausting the gas to the outside the processing chamber 1 is provided on the other side of the opposite side of the substrate carrying port 10 provided on one end side of the lower container 47, and below the upper surface of the exhaust duct 35, when the substrate is processed (see FIG. 2). This exhaust port 5 is connected to a vacuum pump 51, and the gas exhausted from the exhaust duct 35 is exhausted to the outside the processing chamber 1. Inside the processing chamber 1 can be controlled to a prescribed pressure by a pressure controller 20 as needed.

In addition, a thrust-up pin 8 for temporarily holding the substrate 2 when the substrate is carried in and out is provided on the bottom part of the lower part 1*b* of the processing chamber of the lower container 47. This thrust-up pin 8 is provided so as to pass through the through hole provided in the susceptor 6 and a heater 6*a*. The thrust-up pin 8 projects from the through hole and holds the substrate 2. At a substrate processing position of the susceptor (FIG. 2), the thrust-up pin 8 retracts from the through hole, and the substrate is held on the susceptor 6.

Here, the flow of the gas when the substrate is processed will be explained.

The gas supplied from the gas supply ports 3 and 4 is dispersed by a shower plate 8*a*, then is supplied onto the silicon substrate 2 in the processing chamber 1*a*, and radially flows on the silicon substrate 2 outward in the diameter direction of the substrate. Then, it radially flows outward in the diameter direction on the plate 7 whereby an upper side of the outer peripheral part of the susceptor 6 is covered, and is discharged into the annular hollow part 27 from the discharge port 26 provided on the upper surface of the plate 7. The gas thus discharged flows in the hollow part 27 in a peripheral direction of the susceptor, and is exhausted from the plate exhaust port 28 to the exhaust port 5. Thus, turn-around of the gaseous raw material into the processing chamber 1*b*, namely to the backside wall of the susceptor 6 and to the bottom part 42 of the processing chamber 1 can be prevented. Simultaneously at this time, the valves 18 and 19 are opened and the carrying port 10, the through hole 58, the bottom part of the processing chamber 1, the backside wall of the susceptor 6 are purged by the purge gas, and the turn-around of the gaseous raw material to the lower part 1*b* of the processing chamber is prevented.

Note that if a small amount of gaseous raw material is turned around to the lower part 1*b* of the processing chamber, etc, the small amount of gaseous raw material thus invaded is diluted to a level not affecting adversely, and is exhausted from the exhaust port 5.

Note that in the substrate processing apparatus of this embodiment, the gas flow passage capacity at the time of processing the substrate is decreased down from the volume of the entire body of the processing chamber 1, by limiting it to the upper part 1a of the processing chamber formed between the upper surfaces of the susceptor 6 and the plate 7 and the inner wall surface of the upper container 46, and the hollow part 27 of the plate 7.

As described above, the substrate processing apparatus according to this embodiment is constituted.

Next, as one step of the steps of manufacturing a semiconductor device by using the aforementioned substrate processing apparatus, a method of processing a substrate will be explained. Here, as described above, an explanation is given, with an ALD process for depositing a ruthenium film on a silicon substrate, taken as an example.

In FIG. 1, the gate valve 11 is opened, with the susceptor 6 lowered to a carry-in/carry-out position. By a transfer robot 45 in a transfer chamber 9a, one sheet of silicon substrate 2 is carried into the processing chamber 1 through a carrying port 10, and is placed and held on the thrust-up pin 8. After closing the gate valve 11, the susceptor 6 is lifted to a substrate processing position by a lifting/lowering mechanism 9. At this time, the substrate 2 is automatically placed on the susceptor 6 from the thrust-up pin 8. FIG. 2 shows this state. Note that when the susceptor 6 is lifted to the substrate processing position, the upper part 1a of the processing chamber is formed between the upper surfaces of the susceptor 6 and the plate 7 and the inner wall surface of the upper container 46, and the lower part 1b of the processing chamber is formed between the lower surfaces of the susceptor 6 and the plate 7, and the inner wall surface of the lower container 47.

The heater 6a is controlled by a temperature controller 21 to heat the susceptor 6, and the silicon substrate 2 is heated for a fixed time period. The valves 18 and 19 are opened before depositing the film, and a flow in one direction by the purge gas (such as Ar) is formed toward the exhaust port 5, passing through the carrying port 10, the through hole 58, and the lower part 1b of the processing chamber, and an invasion of the gaseous raw material (reactive gas) at the time of depositing the film is prevented. The pressure in the processing chamber 1 is controlled by a pressure controller 20. After the silicon substrate 2 is heated to a prescribed temperature and the pressure is stabilized, the film is started to be deposited. A film deposition is composed of the following four steps, and a plurality of cycles are repeated until the film of a desired thickness is deposited, with four steps set as one cycle.

In step 1, the valve 12 is opened, and the raw material $Ru(EtCp)_2$, whose flow rate is controlled by a liquid flow rate control device 23, is vaporized by a vaporizer 25, and is passed through a shower plate 8a through the supply port 3 from a $Ru(EtCp)_2$ supply line 14, and is introduced into the processing chamber 1 in a state of shower. Note that at this time, a reverse flow of $Ru(EtCp)_2$ gas into an oxygen supply line 15 may be prevented by opening the valve 17 and supplying the purge gas into the oxygen supply line 15. The $Ru(EtCp)_2$ gas is supplied onto the silicon substrate 2, and is adsorbed on its surface. Surplus gas flows into the hollow part 27 of the plate 7 from a discharge port 26 provided on the upper surface of the plate 7, then is exhausted by a plate exhaust port 28, and is exhausted to the outside the processing chamber 1 from the exhaust port 5.

In step 2, the valve 12 is closed and the valve 16 is opened, and the Ar gas, whose flow rate is controlled by the flow rate control device 22, is passed through the shower plate 8a through the supply port 3 from the $Ru(EtCp)_2$ supply line 14, and is supplied into the processing chamber 1 in a state of shower. The $Ru(EtCp)_2$ gas remained in the $Ru(EtCp)_2$ supply line 14 and the processing chamber 1 is purged by Ar and flows through the hollow part 27 of the plate 7 from the discharge port 26 provided on the upper surface of the plate 7, and is exhausted by the plate exhaust port 28, and is exhausted to the outside the processing chamber 1 from the exhaust port 5.

In step 3, the valve 16 is closed and the valve 13 is opened, and oxygen, whose flow rate is controlled by a flow rate control device 24, is activated by a remote plasma unit 33. Activated oxygen is passed through the shower plate 8a from an oxygen supply line 15 through a supply port 4, and is supplied into the processing chamber 1 in a state of shower. Note that the reverse flow of the gas (activated oxygen) into the $Ru(EtCp)_2$ supply line 14 may be prevented by continuously supplying the Ar gas to the $Ru(EtCp)_2$ supply line 14 without closing the valve 16 (by maintaining an opened state). In some cases, without using the remote plasma unit 33, the oxygen is supplied in a state of not being activated. The activated oxygen is supplied onto the silicon substrate 2, and reacts with $Ru(EtCp)_2$ adsorbed on the silicon substrate 2 (by a surface reaction), and a ruthenium film is thereby formed. The surplus gas flows through the hollow part 27 of the plate 7 from the discharge port 26 provided on the upper surface of the plate 7, then is exhausted from the plate exhaust port 28, and is exhausted to the outside the processing chamber 1 from the exhaust port 5.

In step 4, the valve 13 is closed and the valve 17 is opened, and the Ar gas, whose flow rate is controlled by the flow rate control device 22, is passed through the shower plate 8a from the oxygen supply line 15 through the supply port 4, and is supplied into the processing chamber 1 in a state of shower. The oxygen remained in the oxygen supply line and in the processing chamber 1 is purged by Ar and flows through a plate buffer (hollow part) 27 from the discharge port 26 provided on the surface of the plate 7, then is exhausted from the plate exhaust port 28, and is exhausted to the outside the processing chamber 1 from the exhaust port 5.

A plurality of cycles are repeated until the ruthenium film of a desired thickness is deposited, with the aforementioned four steps as one cycle. It is desirable to set the time required for the steps 1 to 4 to be 1 second or less for improving throughput. After depositing the film, the susceptor 6 is lowered to a carry-in/carry-out position by the lifting/lowering mechanism 9, and after the gate valve 11 is opened, the silicon substrate 2 is passed through the carrying port 10 and is carried out to the transfer chamber 9a by the transfer robot 45.

A processing condition is preferably set in a range of temperature: 200 to 500° C., pressure: 0.1 to 10 Torr (13.3 to 1330 Pa), total flow rate of the gas supplied to the processing chamber: 0.1 to 2 slm, and film thickness: 1 to 50 nm.

Note that the temperature of the substrate and the pressure in the processing chamber in each step are controlled by the temperature controller 21, the pressure controller 20, each valve 12 to 13, 16 to 19, the vaporizer 25, the remote plasma unit 33, and the flow rate control devices 22 to 24, etc, and an integrated control is applied to the movement of each part constituting the substrate processing apparatus by a controller 50.

An action of the aforementioned embodiment will be explained hereunder.

First, deposition of the film on the bottom part 42 of the processing chamber, etc, can be prevented. This is because the turn-around of the gas to the lower part 1b of the processing chamber is prevented by exhaustion by the hollow part 27 of the plate 7, and a contact between the gas and the inner wall surface is reduced in the lower part 1*b* of the processing chamber. Note that even if a small amount of gaseous raw material turns around to the lower part 1*b* of the processing chamber, etc, the small amount of gaseous raw material thus turned around is diluted by the purge gas supplied into the lower part 1*b* of the processing chamber by the carrying port 10 and the through hole 58, to the level not allowing film deposition to occur, and is exhausted from the exhaust port 5. Thus, the deposition of the film on the bottom part 42 of the processing chamber, a driving part, the carrying port 10, and the gate valve 11, etc, can be significantly reduced, and particles are prevented from being produced, which is caused by peeling-off of a deposited film when the driving part is actuated.

When the plate 7 having the hollow part 27 is not provided, the gas turns around to the bottom part of the processing chamber, etc, to allow the film to be deposited thereon. Therefore, when the film of more than allowable thickness is deposited, the entire body of the processing chamber or the lower container 47 must be replaced. However, if the processing chamber 1 needs to be replaced, loss of time and cost is enormous. It can be considered that a cover for preventing the deposition is separately set in the bottom part 42 of the processing chamber. However, it is difficult to set the cover in the driving part where the susceptor 6 is lifted and lowered. Therefore, the cover is not practical. In this point, this embodiment efficiently prevents the film to be deposited on the bottom part of the processing chamber, thus eliminating the necessity of replacement of the processing chamber, improving productivity of the device, and reducing a device cost.

Secondly, the film deposition on the susceptor 6 can be prevented. The susceptor 6 has a heater 6*a* for heating the substrate 2, and frequently has a higher temperature than the temperature of the substrate, and the film is also deposited on this susceptor 6. The deposited film is accumulated, and is peeled off in the end, to become a particle source, thus reducing a yield ratio of a semiconductor. However, according to this embodiment, a part of the plate 7 (inside part 36*b* of the plate) covers the upper side of the peripheral part of the susceptor 6, thus making it possible to prevent the deposition of the film on the outer peripheral part of the susceptor 6. Even if a small amount of deposition proceeds on the susceptor 6, maintenance by gas cleaning is performed before the deposited film peels-off, when the film can be removed by the gas cleaning. However, in this case, a film depositing progression on the susceptor 6 is slow, because a part of the plate 7 covers the upper side of the outer peripheral part of the susceptor 6. Therefore a maintenance cycle can be prolonged. Accordingly, a rate of operation of the device is increased, thereby improving the productivity. Meanwhile, when it is difficult to remove the film by gas cleaning, the susceptor 6 is replaced. In this case also, since a part of the plate 7 covers the upper side of the outer peripheral part of the susceptor 6, the progression of the film deposition is slow, the cycle of replacement of the susceptor is prolonged, and a service life can be prolonged. Accordingly, the rate of operation of the device is increased, thus improving the productivity and reducing the device cost.

Further the film is also deposited on the plate 7. However, in this case, without replacing the susceptor 6, only the plate 7 may be replaced. Therefore, the time and cost required for replacement can be largely reduced.

Thirdly, the contact-gas area and the flow passage capacity of the gas supplied from the supply ports 3 and 4 can be reduced. This is because the plate 7 having the hollow part 27 is set on the outer peripheral part of the susceptor 6, and the gap between the sidewall 40 of the processing chamber and the sidewall 60 of the susceptor is closed by the first plate 37 constituting the hollow part 27, and the gas is exhausted from the hollow part 27 to the exhaust port 5 without passing through the lower part 1*b* of the processing chamber.

By reducing the contact-gas area in this way, a deposition amount of the gaseous raw material in the processing chamber is reduced, and the particles are prevented from being produced.

In addition, by reducing the flow passage capacity, an amount of an existence of the gaseous raw material itself in the processing chamber can be reduced, and the amount of the gaseous raw material to be supplied and the amount of a residual gaseous raw material are reduced. Therefore, the gaseous raw material can be efficiently supplied, or the residual gas can be purged. Accordingly, in the film deposition method wherein two kinds of reactive gases are alternately supplied, supply of the gaseous raw material and purge of the residual raw material can be performed in a short time.

As a result, the semiconductor manufacturing apparatus with high yield ratio, high throughput, and excellent in productivity can be realized.

Fourthly, the volume of the entire body of the processing chamber can be made small. If the entire body of the plate 7 having the hollow part 27 is fixed to the substrate processing position, when the substrate is carried in and carried out, the substrate carrying port 10 is required to be disposed below the plate 7, so that the plate 7 is not overlapped on the substrate carrying port 10 to permit the substrate to be carried in and carried out the processing chamber. A problem involved therein is that the entire body of the processing chamber becomes higher, thus making the volume of the entire body of the processing chamber larger. However, in this embodiment, the plate 7 is liftably provided, and therefore when the substrate is carried in and carried out, the plate 7 can be disposed on the sidewall of the susceptor 6, below the substrate carrying port 10, and when the substrate is processed, the plate 7 can be disposed so as to overlap on the substrate carrying port 10, thus making it possible to decrease the height of the entire body of the processing chamber by this overlapped portion. Therefore, the volume of the entire body of the processing chamber can be made small, and purge efficiency can thereby be further enhanced.

Note that in this embodiment, Ru(EtCp)$_2$, being the metal containing raw material, is used as the first reactive gas, and oxygen O$_2$, being the gas containing oxygen or nitrogen, is used as the second reactive gas. However, the gas used in the present invention can be suitably selected from various kinds in accordance with a purpose of use. For example, the metal containing gaseous raw material includes any one of Si, Al, Ti, Sr, Y, Zr, Nb, Sn, Ba, La, Hf, Ta, Ir, Pt, W, Pb, and Bi other than the metal containing Ru. Also, the gas containing oxygen or nitrogen includes O$_3$, NO, N$_2$O, H$_2$O, H$_2$O$_2$, N$_2$, NH$_3$, and N$_2$H$_6$ other than O$_2$, and radical species or ionic species generated by activating any one of the aforementioned gases by an activating means.

In addition, as the film deposition method according to this embodiment, the ALD has been explained, and the cyclic MOCVD is also referred to. However of course this embodiment can also be utilized in a MOCVD (Metal Organic Chemical Vapor Deposition) whereby the film is deposited by simultaneously supplying the metal containing raw material and the gas containing oxygen or nitrogen, or by thermally decomposing the metal containing raw material.

Also, in the aforementioned embodiment, explanation has been given to a case that the discharge port 26 of the plate 7 having the hollow part 27 is not formed, with an upper part of the hollow part 27 fully opened, but is formed in such a way that it is narrowed down to be a slit shape, so that the discharge port 26 has a function of conductance adjustment. Also, explanation has been given to a case that a part of the plate 7 covers only a part of the susceptor 6, and the plate 7 is separately constituted from the susceptor 6. Further, explanation has been given to a case that the plate exhaust port 28 is formed on the outer sidewall of the plate 7. However, the present invention is not limited thereto, and various modifications are possible.

For example, the plate as shown in FIG. 5(a) exemplifies a mode that the discharge port 26 of the plate 7 having the hollow part 27 does not have the function of conductance adjustment. Namely, this shows the discharge port 26 wherein the recessed part 37a of the first plate 37 is not covered by the second plate 36, and the opening upper part of the recessed part 37a is made fully opened. In a case of the ALD, wherein adsorption of the gas on the silicon substrate 2 is mainly performed and an influence of gas flow is small, it may take a mode of not performing the conductance adjustment. Therefore, the mode thus exemplified is preferably applied to the ALD.

Note that a ring-shaped discharge port 26 is not equally set to have the same width over the whole peripheral part, but the conductance on the exhaust port side and on the opposite side thereto may be changed, by changing a size (width) of the slit forming the discharge port on the exhaust port side and a size (width) of the slit forming the discharge port on the opposite side of the discharge port. This is effective when gas pressure is different between the exhaust port side and the opposite side thereto and a pressure distribution on the substrate can not be equalized.

Also, a modified example of the plate shown in FIG. 5(b) shows a case that a part of the plate 7 covers an entire body of the surface of the susceptor 6. When the entire body of the surface of the susceptor 6 is covered, film deposition on the susceptor 6 can be further prevented. However, in this case, heat conductivity from the heater 6a in the susceptor 6 is poor, and therefore selection in accordance with the film deposition method is required. For example, although temperature dependency is higher in the cyclic MOCVD, the temperature dependency is not so high in the ALD. Accordingly, it is preferable to apply this modified example to the ALD.

Further, in the example shown in FIG. 3(b) and FIG. 3(d), the plate discharge port 28 is provided only on the outer sidewall of the first plate 37. However, as shown in FIG. 5(c), the plate discharge port 28 may be provided in a range from the outer sidewall to a bottom surface of the first plate 37, or may be provided only on the bottom surface.

Also, in FIG. 3 and FIG. 4, the diameter of a hole provided in the center part of the second plate 36 is made approximately same as the diameter of the silicon substrate 2. However, as is shown in a third embodiment as will be described later, the diameter of the hole provided in the center part of the second plate may be made smaller than the diameter of the silicon substrate 2, and the second plate 36 may be placed so as to cover the outer peripheral part of the silicon substrate 2. With such a structure, film deposition on the outer peripheral part of the silicon substrate can be prevented, which is required in some steps of manufacturing the semiconductor device, such as a deposition step of the film of a metal system such as Ru.

Also, in the modified example of the plate as shown in FIG. 6, the plate 7 having the hollow part 6b is integrally formed with a main body 6c of the susceptor 6. When the susceptor 6 and the plate 7 (exhaust duct) are thus integrally formed, the structure can be simplified. Note that in this case, AlN is preferable as a material of the susceptor. In addition, in this modified example, an opening area of the discharge port 26 on the opposite side of the exhaust port 5 is made larger than the opening area of the discharge port 26 on the exhaust port 5 side, and the conductance of the discharge port 26 on the opposite side of the exhaust port 5 (plate exhaust port 28) is made larger than the conductance of the discharge port 26 on the exhaust port 5 side.

Incidentally, as described above, in the first embodiment, the gap between the sidewall 40 of the processing chamber and the outer peripheral sidewall 60 of the susceptor 6 is closed by the plate 7. Therefore, it is possible to prevent the turn-around of the gas supplied to the upper part 1a of the processing chamber, to the lower part 1b of the processing chamber when the substrate is processed. However, in this case also, a part of the plate 7 is placed on the susceptor 6, so as to be lifted and lowered in the processing chamber 1 together with the susceptor 6. Therefore, the gap between the sidewall 40 of the processing chamber and the sidewall of the plate 7 must be secured, thus making it impossible to avoid the formation of the gap. Therefore, when the substrate is processed, it appears that some of the gas supplied to the upper part 1a of the processing chamber is not discharged into the hollow part 27 of the plate 7 constituting the exhaust duct 35, but is turned around to the lower part 1b of the processing chamber through this gap.

In this point, the following knowledge is obtained. Namely, when the plate is carried to the substrate processing position, the gap formed between the sidewall of the plate and the sidewall of the processing chamber is closed at the substrate processing position, thus eliminating the turn-around of the aforementioned some gases. Then, in order to realize this structure, it is found that the plate is made separable, one of the plates thus separated is liftably provided, and the other plate is held at the substrate processing position, and the gap formed between one of the plates and the sidewall of the processing chamber is closed from above by other plate when one of the plates is carried to the substrate processing position.

FIG. 7 and FIG. 8 are sectional views of the single wafer type substrate processing apparatus according to a second embodiment, wherein by using such a separable plate, it is possible to prevent the turn-around of the aforementioned some of the gases. FIG. 7 is a vertical sectional view at the time of carrying-in and carrying-out the substrate, and FIG. 8 is a vertical sectional view at the time of processing the substrate. The second embodiment has basically the same structure as that of the first embodiment, and the same sings and numerals are assigned to the same parts, and explanation therefore is omitted. A different point from the first embodiment is that the plate 7 having the hollow part 27 constituting the exhaust duct 35 of the first embodiment is made separable. Mainly the different point from the first embodiment will be explained hereunder in detail.

The exhaust duct 35 is constructed by the plate 7 having the hollow part 27 that communicates with the processing chamber 1, and the plate 7 is composed of a first plate 39 having a recessed part 39a and a second plate 29 covering the recessed part 39a of the first plate 39, and they are made separable.

This first plate 39 is composed of the recessed part 39a and a flat plate part 39b. The recessed part 39a is provided so as to close the gap between the sidewall 60 of the susceptor 6 and the sidewall 40 of the processing chamber 1, and an exhaust passage is formed for introducing to the exhaust port the gas supplied into the upper part 1a of the processing chamber when the substrate is processed. The recessed part 39a, with an upper part opened, has the plate exhaust port 28 at a position corresponding to the discharge port 5. The flat plate part 39b is placed on the susceptor 6, in a state of covering the entire body of the susceptor 6, and is constructed by a discoidal plate for preventing the deposition of the film on the susceptor 6. The first plate 39, with its flat plate part 39b placed on the susceptor 6, is liftably provided together with the susceptor 6.

The second plate 29 is held at the substrate processing position. This second plate 29 is constructed by a sheet of circular plate in a donut shape. A hole 34 for containing the substrate 2 is provided on the inner peripheral part of the second plate 29, and a plurality of discharge ports 26 arrayed in a ring-shape are provided on the outer peripheral part covering the recessed part 39a of the first plate 39. The second plate 29 is held by a stepped part (protruding part) 41 provided on the inner peripheral part of the processing chamber 1. A lower side of the sidewall 40 of the upper container 46 is provided inwardly of the processing chamber 1 from an upper side, and a part where the lower side of the inner sidewall 40b of the upper container 46 is inwardly protruded from the upper side of the inner sidewall 40a, is defined as the aforementioned stepped part 41. By holding the second plate 29 on this stepped part 41, the gap between the stepped part 41 of the processing chamber 1 and the second plate 29 is eliminated.

Note that out of the second plate 29, the inner peripheral part side is called a plate inside part 29b, and the outer peripheral part side is called a plate outside part 29a, with the discharge port 26 as a border. Since the plate outside part 29a and the plate inside part 29b are integrally formed, the aforementioned discharge port 26 can not be continuously formed but discontinuously formed, from necessity of supporting the plate inside part 29b by the plate outside part 29a directly held on the stepped part 41.

Incidentally, in the aforementioned structure, as shown in FIG. 7, when the susceptor 6 is lowered to the carry-in/carry-out position, the first plate 39 is disposed below the substrate carrying port 10 so as not to cause obstruction for carrying in and carrying out the substrate. The second plate 29 is held on the stepped part 41 in a horizontal posture. After the substrate 2 is carried into the processing chamber 1 and is placed on the thrust-up pin 8, the susceptor 6 is lifted to the substrate processing position by a lifting/lowering mechanism 9. The first plate 39 placed on the susceptor 6 is lifted together with the susceptor 6, along with the lift of the susceptor 6. In the intermediating point of lifting the susceptor 6 to the substrate processing position, the substrate 2 is automatically placed on the first plate (flat plate part 39b) placed on the susceptor 6, from the thrust-up pin 8.

As shown in FIG. 8, when the susceptor 6 is lifted to the substrate processing position, the upper part of the opening of the recessed part 39a of the first plate 39 is covered by the second plate 29 held at the substrate processing position, and the hollow part 27 is formed. This hollow part 27 becomes an exhaust passage having the same function as the hollow part 27 of the first embodiment. In this case, even if the gap is formed between the sidewall of the plate 7 and the sidewall 40 of the processing chamber, the flow passage leading to this gap from the upper part 1a of the processing chamber is closed by the second plate 29 held on the stepped part 41.

In this way, according to the second embodiment, the plate is made separable, and the hollow part 27 is formed by covering the opening upper part of the recessed part 39a of the first plate 39, with the second plate 29. Therefore, in the same way as the case of an integral type plate having the hollow part 27 of the first embodiment, the gas supplied into the upper part 1a of the processing chamber is distributed to the hollow part 27 from the gas discharge port 26, then exhausted from the plate exhaust port 28 and exhausted outside the processing chamber 1 from the exhaust port 5. Particularly, in the second embodiment, the flow passage from the processing chamber 1a to the gap inevitably formed between the sidewall of the plate 7 and the sidewall 40 of the processing chamber is interrupted by the second plate 29 held on the stepped part 41. Therefore, some gas supplied to the upper part 1a of the processing chamber at the time of processing the substrate is prevented from turning around the lower part 1b of the processing chamber by passing through the aforementioned gap, without being discharged into the hollow part 27.

In the aforementioned second embodiment, explanation has been given to a case in which the first plate 39 is placed on the susceptor 6, with an entire body of the upper surface of the susceptor 6 covered by the first plate 39. However, as shown in FIGS. 10(a) and (b), in the same way as the second plate 29, by forming the hole in which the substrate 2 is disposed (received) in the center part of the first plate 39, the first plate 39 may be placed on the susceptor 6 together with the second plate 29, while covering a part (outer peripheral part) of the susceptor 6.

Incidentally, in the aforementioned embodiments of FIG. 7, FIG. 8 or FIG. 10, by closing the gap formed between the sidewall of the plate 7 and the sidewall 40 of the processing chamber by the second plate 29 placed on the stepped part 41, the turn-around of the gas to the lower part 1b of the processing chamber from this gap is prevented. In this case, it appears that the gap is formed between the second plate 29 itself and the upper surface of the stepped part 41. Namely, as shown in FIG. 9, when the opening upper part of the recessed part 39a of the first plate 39 is covered by the second plate 29 by lifting the susceptor 6, it appears that the second plate 29 is lifted by the first plate 39, and a gap 31 is formed between the stepped part 41 and the second plate 29. Ideally, the first plate 39 should be come in contact with the second plate 29 so as not to form the gap 31. However, formation of the aforementioned gap 31 is inevitable, by an accuracy of the lifting/lowering mechanism of the susceptor 6, and dimension accuracy in manufacturing the first plate 39 and the second plate 29. When the conductance of this gap 31 becomes the conductance that can not be neglected with respect to the discharge port 26, it appears that the gas supplied to the silicon substrate 2 from the supply ports 3 and 4 flows to the hollow part 27 from the discharge port 26, being the gas flow passage, and also flows (turns-around) to the lower part 1b of the processing chamber from the gap 31.

In this case, it is possible to make the conductance on the side of the gap 31 smaller than the discharge port 26. However, an actual dimension is estimated to be about 5 mm for the discharge port and about 2 mm for the gap 31. In this case, as compared to the discharge port 26, the gas of an amount that can not be neglected from point of the gap 31 is exhausted.

In this point, the following knowledge is obtained. Namely, unless the second plate 29 placed on the stepped part 41 is not lifted by the first plate 39 when the first plate 39 is carried to the substrate processing position, the gap 31 is not formed between the stepped part 41 and the second plate 29. Such a situation further makes the second plate 29 separable, and when the first plate 39 is carried to the substrate processing position, one of the separated plates of the second plate 29 is kept placed on the stepped part 41, and only the other separated plate of the second plate 29 is lifted by the first plate 39. With this structure, the third embodiment can be realized.

FIG. 11 shows the third embodiment as described above, wherein the second plate 29 in the second embodiment is made separable, and by not forming the gap 31 between the stepped part 41 and the second plate 29, the aforementioned turn-around of the gas is prevented. FIG. 11 is an explanatory view of an essential part of the substrate processing apparatus, and (a) is a vertical sectional view of an essential part at the time of carrying-in/carrying-out the substrate, and (b) is a vertical sectional view of an essential part at the time of processing the substrate. In addition, FIG. 14 is an explanatory view of the first plate 39, (a) is a perspective view, (b) is a sectional view taken along the line A-A', and (c) is a sectional view taken along the line B-B. Also, FIG. 15 is a perspective view of separating the second plate 29.

As shown in FIG. 11, the first plate 39 is constructed by a type covering an entire part of the upper surface of the susceptor 6. As shown in FIG. 14(a), the first plate 39 has the recessed part 39a, with the upper part opened outside, and has a circular flat plate part 39b inside for covering the entire part of the upper surface of the susceptor. The recessed part 38 is provided in the upper surface center of this flat plate part 39b, so as to receive the substrate 2 in the recessed part 38, and when the substrate 2 is placed in the recessed part 38, the surface of the substrate 2 is flush with the upper surface of the outer peripheral part of the flat plate part 39b. A swelling part of the outer periphery of the flat plate part 39 lifts the inside plate 29d as will be described later, and in order not to lift an outside plate 29c, an upper surface position of the part thus swelled may be set higher than the position of the upper end part of the outer sidewall of the recessed part 39a.

In addition, as shown in FIG. 14(b), the recessed parts 39a are provided on both sides, and the plate exhaust port 28 is provided on the exhaust port side opposite side of the gate valve side of the recessed part 39a. Also, as shown in FIG. 14(c), the recessed parts 39a with no plate exhaust port 28 are provided on both sides of the first plate 39.

As shown in FIG. 11(a), the second plate 29 has an inside plate 29d and an outside plate 29c, and they are made separable. The outside plate 29c is placed on the stepped part 41. The inside plate 29d is placed on this outside plate 29c. Specifically, as shown in FIG. 15, the second plate 29 has a ring-shaped inside plate 29d and a ring-shaped outside plate 29c with larger outer diameter and smaller inner diameter than the outer diameter of the inside plate 29d. An engagement part composed of the stepped part is formed on the inner peripheral part of this outside plate 29c, and a to-be-engaged part composed of the stepped part engaging with the aforementioned engagement part is formed on the outer peripheral part of the inside plate 29d. The inside plate part 29d is concentrically placed on the outside plate 29c, so as to be partially overlapped one another. As a partially overlapped constitution, as shown in FIG. 11(a) and FIG. 15, it may be so constituted that an overlapped portion is not made thicker by engagement of the stepped parts, and when the inside plate 29d is placed on the outside plate 29c, they are made to be a single surface. When the susceptor 6 is located at a substrate carry-in/carry-out position, the inside plate 29d is placed on the outside plate 29c. Therefore, the gap becoming the discharge port 26 as will be described later is not formed between the inside plate 29d and the outside plate 29c of the second plate.

As shown in FIG. 11(b), in a state of moving the susceptor 6 to the substrate processing position, only the inside plate 29d comes in contact with the first plate 39, and the outside plate 29c does not come in contact with the first plate 39. By the aforementioned contact of the inside plate 29d and the first plate 39, the inside plate 29d is lifted by the first plate 39 and is separated from the outside plate 29c, and the gap is formed between the inside plate 29d and the first plate 39. The discharge port 26 for discharging the gas supplied into the upper part 1a of the processing chamber is formed by this gap. Meanwhile, since the outside plate 29c does not come in contact with the first plate 39, the gap between the stepped part 41 and the outside plate 29c is kept closed, and the gap is not formed.

In addition, as shown in FIG. 11(b), when the inside plate 29d comes in contact with the first plate 39, the outer periphery of the silicon substrate 2 is covered by the inside plate 29d. This is because the inside plate 29d is made to have a film deposition preventive function to the outer periphery of the silicon substrate, which is required in some step of the substrate processing steps.

As described above, according to the third embodiment, the gap is not formed between the stepped part 41 and the second plate 29. Therefore, from such a gap, the exhaust of the gas of the quantity that can not be neglected can be efficiently prevented. Note that as is clarified from a part surrounded by a dot-line of FIG. 11, since the outside plate 29c does not come in contact with the first plate 39, the gap 30 is formed between the outside plate 29c and the first plate 39. Namely, it can be considered in such a way that the gas supplied to the upper part 1a of the processing chamber and discharged from the discharge port 26 into the hollow part 27 turns around the lower part 1b of the processing chamber. However, in this point, by enlarging an opening area of the plate exhaust port 28 provided in the first plate 39 and sufficiently enlarging the conductance of this plate exhaust port 28, namely by making a resistance of gas flow small, the gas discharged into the hollow section 27 is prevented from turning around the lower part 1b of the processing chamber from the gap 30.

Here, a comparison is made between the constitution of FIG. 11(b) wherein the gap 30 is formed between the outside plate 29c and the first plate 39, and the constitution of FIG. 9 wherein the gap 31 is formed between the outside plate 29c and the stepped part 41. Then, it is found that in FIG. 9, the gas supplied to the silicon substrate 2 from the supply ports 3 and 4 is discharged from both of the gap 31 and the discharge port 26. Although the conductance of the gap 31 is smaller than the conductance of the discharge port 26, the gas that can not be neglected is discharged from the gap 31, compared to the discharge port 26. Meanwhile, in FIG. 11(b), the gas supplied to the silicon substrate 2 from the supply ports 3 and 4 flows to the hollow part 27 from the discharge port 26 which is only one gas flow passage. In the hollow part 27, by largely opening the plate exhaust port 28, the conductance of the plate exhaust port 28 is made sufficiently larger than the conductance of the gap 30. Whereby, gas leak from the gap 30 can be suppressed. Here, even if it is so assumed that the gap 30 and the gap 31 have the same dimension, from the difference in constitution as described above, gas turn-around to the lower part 1b of the processing chamber from the aforementioned gap can be more prevented and the advantage of reducing the contact-gas area and the flow passage volume is increased in the constitution of FIG. 11(b) than the constitution of FIG. 9.

In addition, in the third embodiment, it is also possible to make the conductance of the gap 30 small, to suppress the gas flow from the gap 30. For example, as shown in FIG. 12, a recessed place is provided on the backside of the plate outside part 29a, and an outside wall upper edge of the first plate 39 is engaged with this recessed place so as not to be contacted with each other. According to this third embodiment, a Labyrinth structure is formed by the gap 30, and the conductance of the gap 30 becomes small, thus making it possible to further suppress the gas flow from the gap 30.

As described above, according to the third embodiment, the gap is not formed between the stepped part 41 and the second plate 29 when the susceptor 6 is lifted, the opening upper part of the recessed part 39a of the first plate 39 is covered by the second plate 29, and the hollow part 27 is formed. Therefore, the turn-around of the gas to the lower part 1b of the processing chamber by passing through the gap does not occur. Also, at this time, the inside plate 29d of the second plate 29 is elevated by the first plate 39, and the gap for communicating the lower part 1a of the processing chamber and the hollow part 27 is formed between the outside plate 29c and the inside plate 29d. Therefore, the discharge port 26 for discharging the gas into the hollow part 27 of the plate 7 from the upper part 1a of the processing chamber can be secured.

In addition, the third embodiment can be variously modified. For example, in the third embodiment, the discharge port 26 formed by the inside plate 29d and the outside plate 29c constituting the second plate 29 has a function of adjusting the conductance, to equalize the gas flow on the silicon substrate 2. However, depending on the film deposition condition, the adsorption on the silicon substrate 2 is mainly performed, and when the influence of the gas flow is small, it is not necessary to adjust the conductance. Therefore, the third embodiment may be modified to have only the outside plate 29c of the first plate 39 and the second plate 29.

In addition, in the third embodiment, explanation is given to a case of covering a part of the substrate 2 by the second plate 29. However, the substrate 2 may not be covered by the second plate 29. When the substrate 2 is not covered by the second plate 29, a division place between the first plate 39 and the second plate 29 forming the hollow part 27 can be variously modified. Such a modified example is shown in FIG. 13.

In a plate structure of FIG. 13(a), a part corresponding to the inside plate of the second plate covering a part of the recessed part 39a is added to the first plate 39. In the second plate 29, the part corresponding to the inside plate is removed, and it is constituted only by a part corresponding to the outside plate covering a remaining part of the recessed part 39a. In the plate structure of FIG. 13(b), although the part corresponding to the inside plate of the second plate is added to the first plate 39, a rising part of the outside constituting the recessed part 39a is removed. In the second plate 29, although the part corresponding to the inside plate is removed, the part corresponding to the rising part of the outside constituting the recessed part 39a is added.

According to these modified examples, by changing the division place between the first plate and the second plate, the part corresponding to the inside plate covering the recessed part is added to the first plate. Therefore, the second plate can be constituted only by the part corresponding to the outside plate always held by an unmovable stepped part 41, and thus the second plate can be simplified.

In addition, in the aforementioned first to third embodiments, explanation has been given to a case that any one of the supply ports for supplying the gas into the processing chamber is a flowing type in the diameter direction using the shower head. However, the gas supplying method of the present invention is not limited thereto, but can be applied to a one way flowing type.

Here, the one way flowing type is the type of supplying the gas from the gas supply port provided on the sidewall of the substrate to the surface of the substrate, allowing one way flow on the substrate, and exhausting the gas from the exhaust port provided on the opposite side of the gas supply port.

FIG. 16 is a vertical sectional view at the time of processing the substrate, for explaining the single wafer type substrate processing apparatus according to a fourth embodiment of the one way flowing type. Basically, the fourth embodiment has the same constitution as the third embodiment, and the same signs and numerals are assigned to the same parts, and explanation therefore is omitted. A different point is that the supply ports 3 and 4 are provided so as to communicate with a space on the side of the substrate 2 and above the plate 7, to thereby supply the gas to the substrate 2.

As shown in the figure, the gas supply ports 3 and 4 are directly connected to the substrate carrying port 10 side of the processing chamber 1 of the upper container 46, without interposing the shower plate, to thereby supply the gas into the processing chamber 1 from above the plate 7. The gas flown to the upper part 1a of the processing chamber above the plate 7 in the processing chamber 1 from the gas supply ports 3 and 4 collides against the second plate 29, then a course is changed, and some of the gas is discharged into the hollow part 27 from the discharge port 26 on the upper stream side to pass around the hollow part 27, which is then exhausted to the exhaust port 5 from the plate exhaust port 28. The residual gas performs one way flow toward the discharge port 26 on the downstream side on the substrate 2 along the second plate 29, and is discharged into the hollow part 27 from the discharge port 26, and is exhausted to the exhaust port 5 from the plate exhaust port 28.

When the present invention is applied to the substrate processing apparatus thus having the supply port of one way flow type, the gas can be directly supplied into the processing chamber. Therefore, the residual gas can be quickly exhausted, compared to a case of supplying the gas through the shower plate. Therefore, the purge efficiency can be further enhanced.

DESCRIPTION OF SIGNS AND NUMERALS

Figure 1:
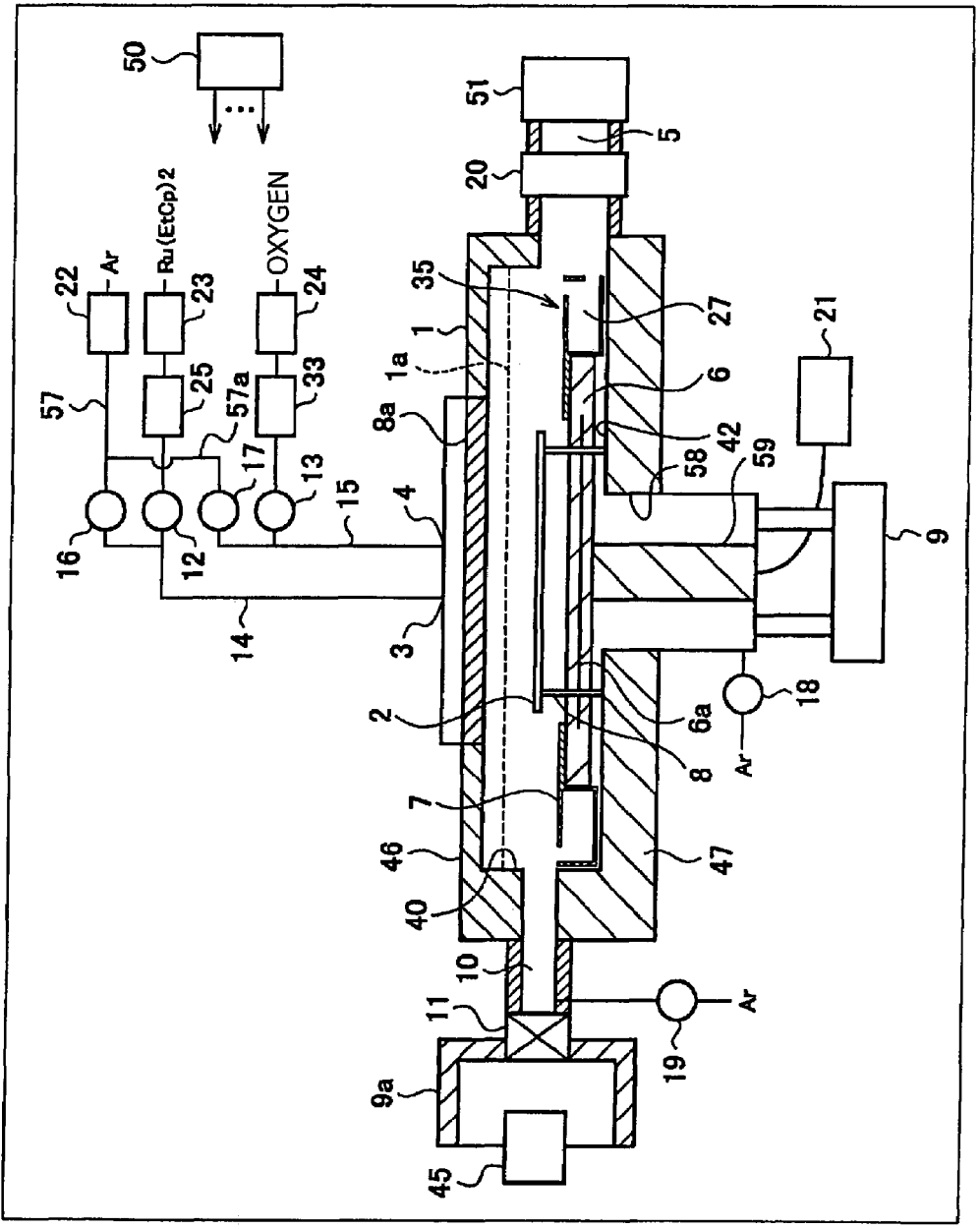
FIG. 1 is a vertical sectional view at the time of carry-in/carry-out of a substrate for explaining a substrate processing apparatus according to a first embodiment.
Figure 2:
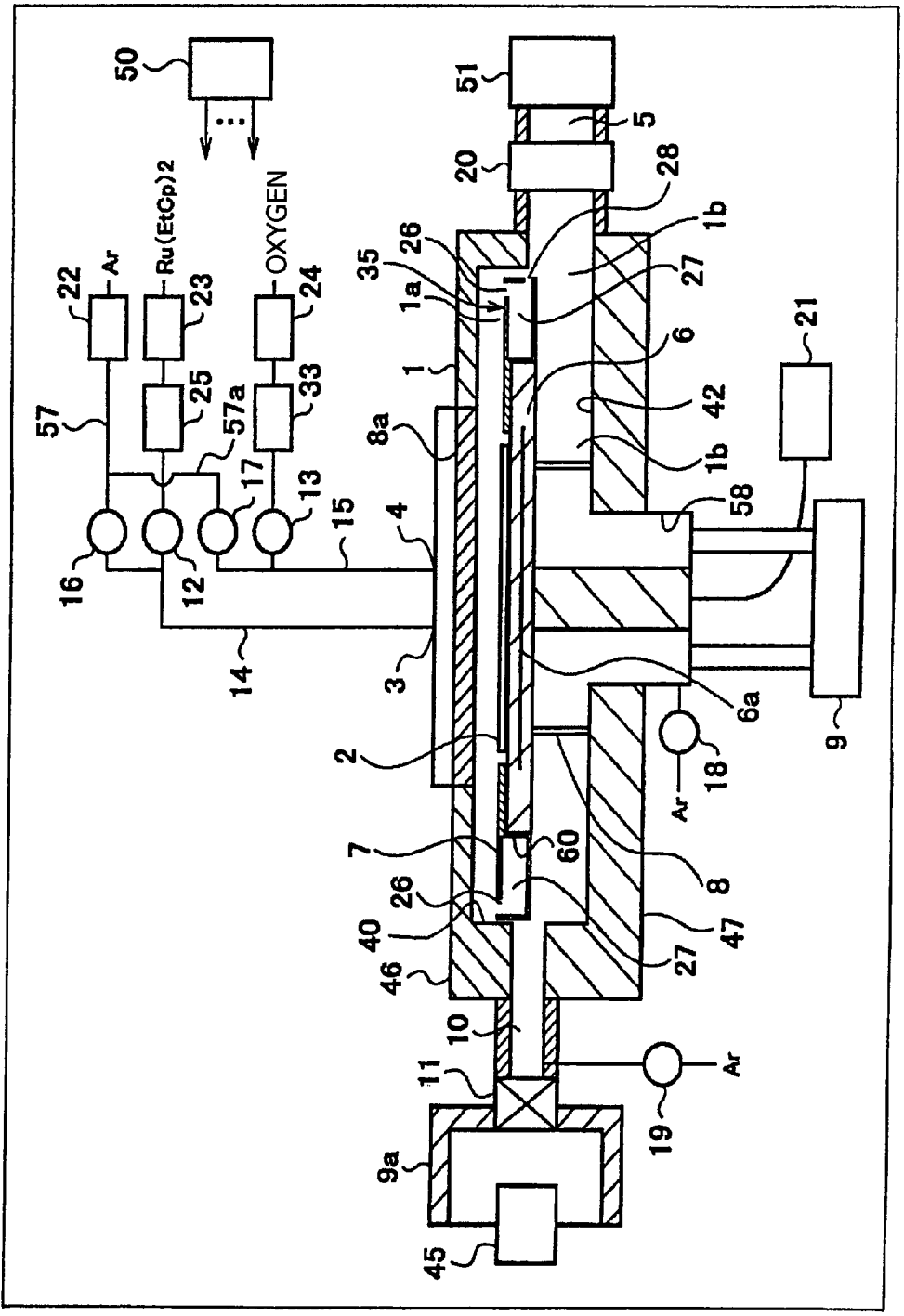
FIG. 2 is a vertical sectional view at the time of film deposition for explaining the substrate processing apparatus according to the first embodiment.
Figure 3:
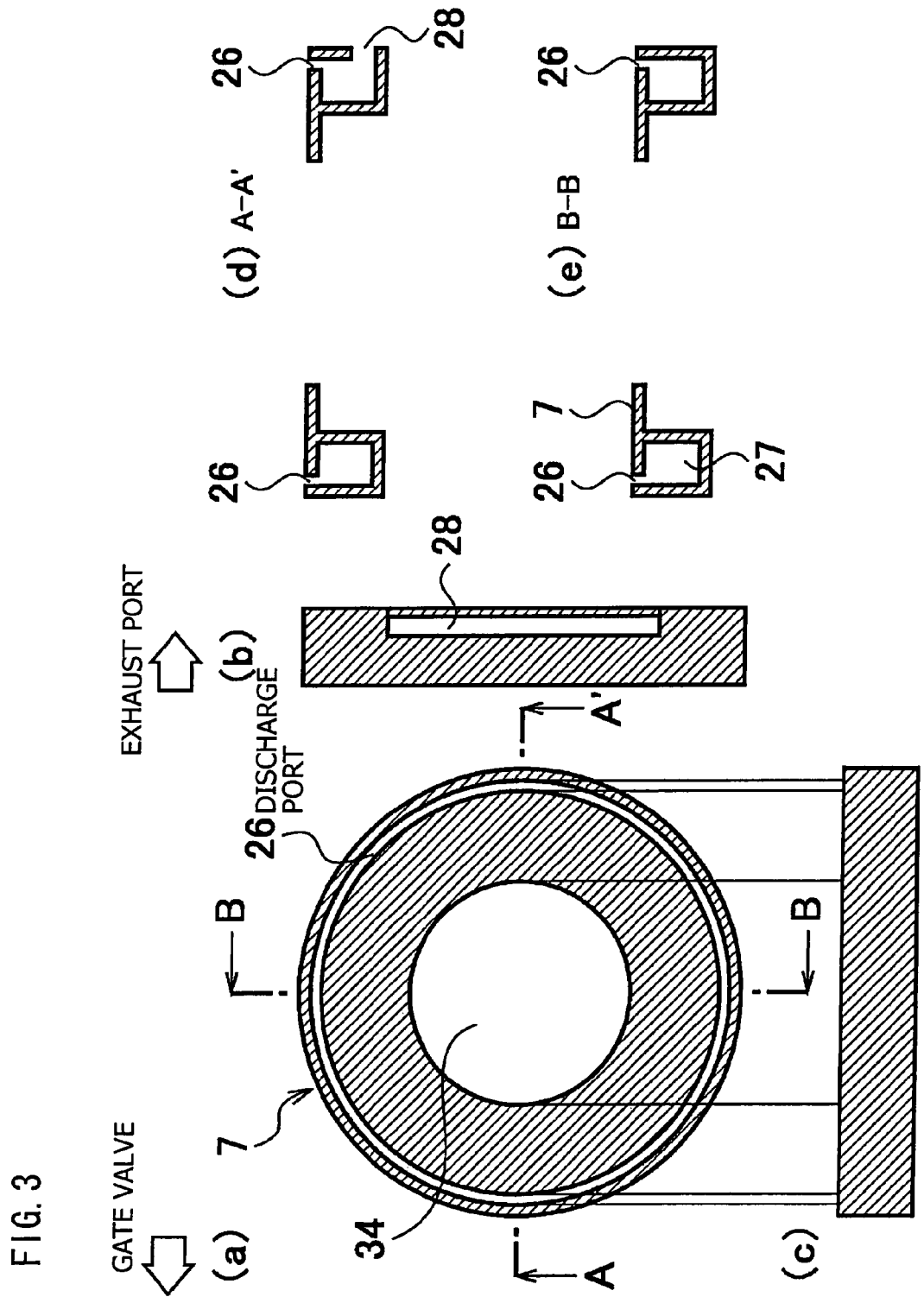
FIG. 3 is an explanatory view of a plate according to the first embodiment, (a) is a plan view, (b) is a side view, (c) is a front view, (d) is a sectional view taken along the line A-A', and (e) is a sectional view taken along the line B-B.
Figure 4:
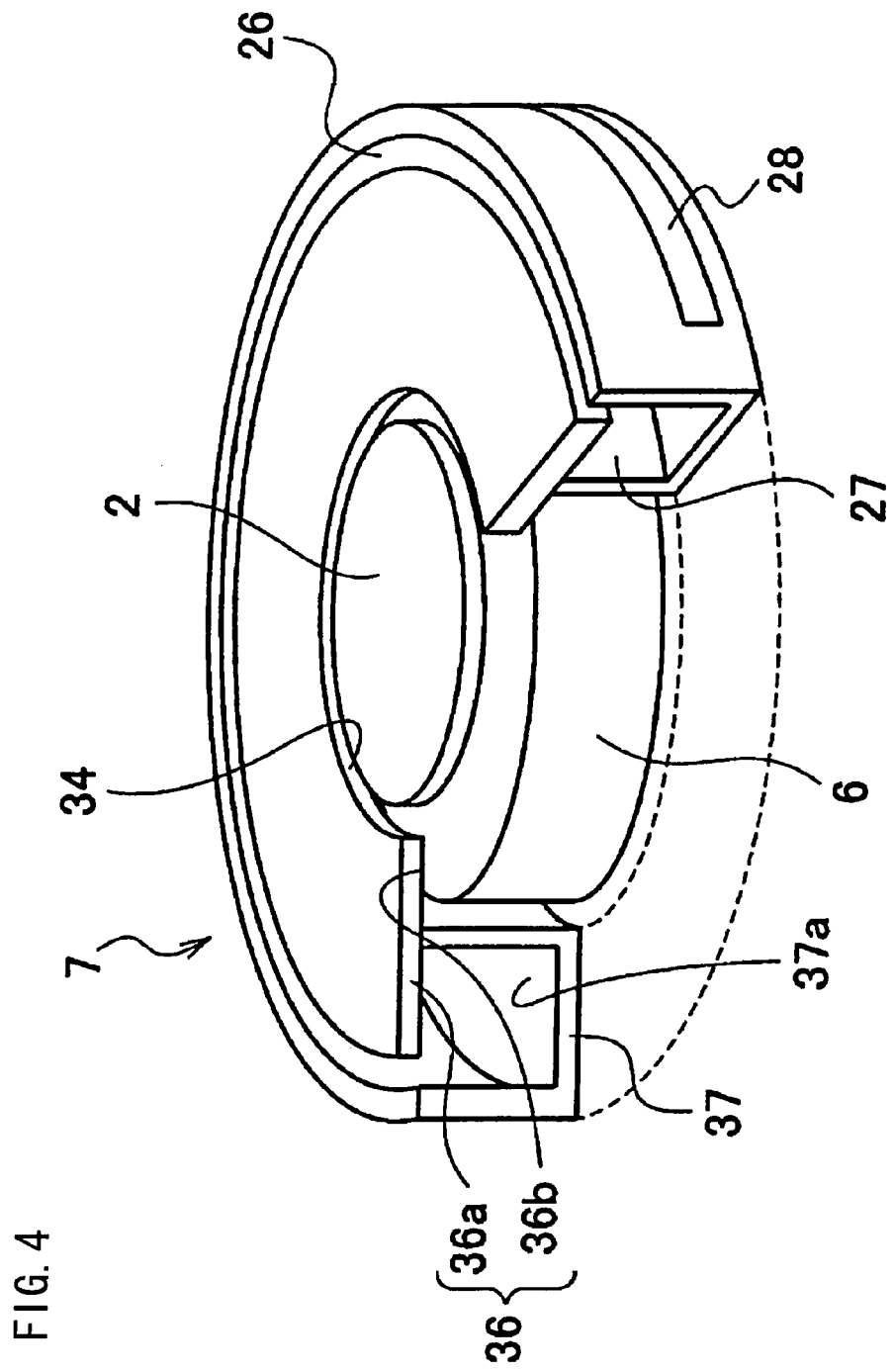
FIG. 4 is a partially broken perspective view of the plate according to the first embodiment.
Figure 5:
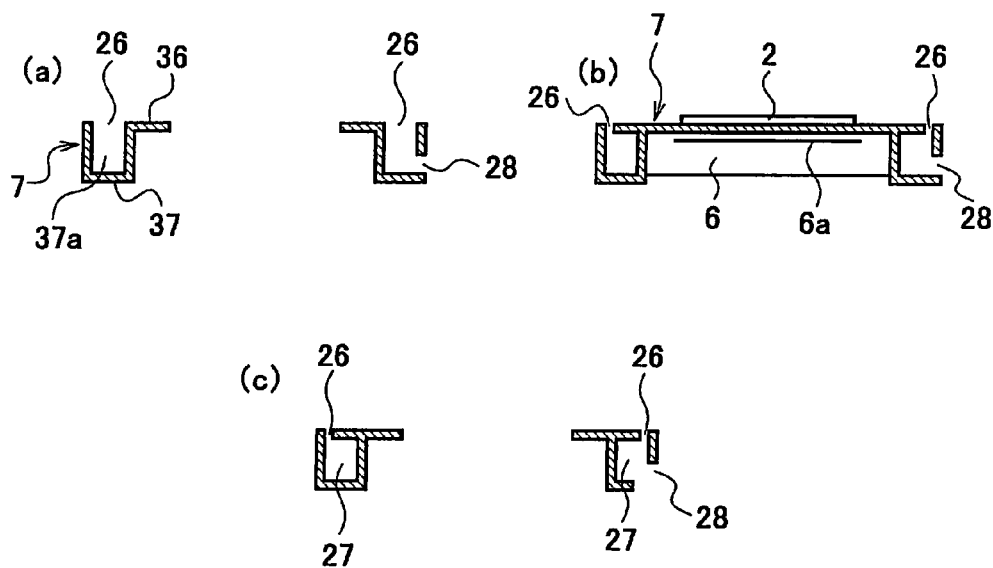
FIG. 5 is an explanatory view showing a modified example of the plate according to the first embodiment, (a) is a sectional view of the plate of a type in which a discharge port does not have a function of adjusting a conductance, (b) is a sectional view of the plate of the type in which the plate covers an entire body of a susceptor, and (c) is a sectional view of the plate in which a plate exhaust port is provided in a range from an outside wall of a hollow part to a bottom surface.
Figure 6:
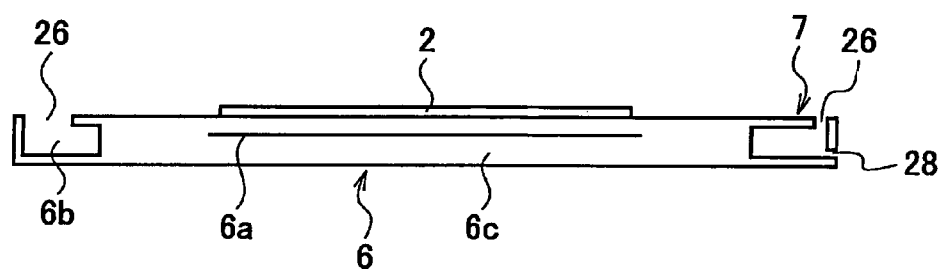
FIG. 6 is an explanatory view of a modified example of the plate according to the first embodiment, and is a sectional view of the susceptor integrally formed with the plate.
Figure 7:
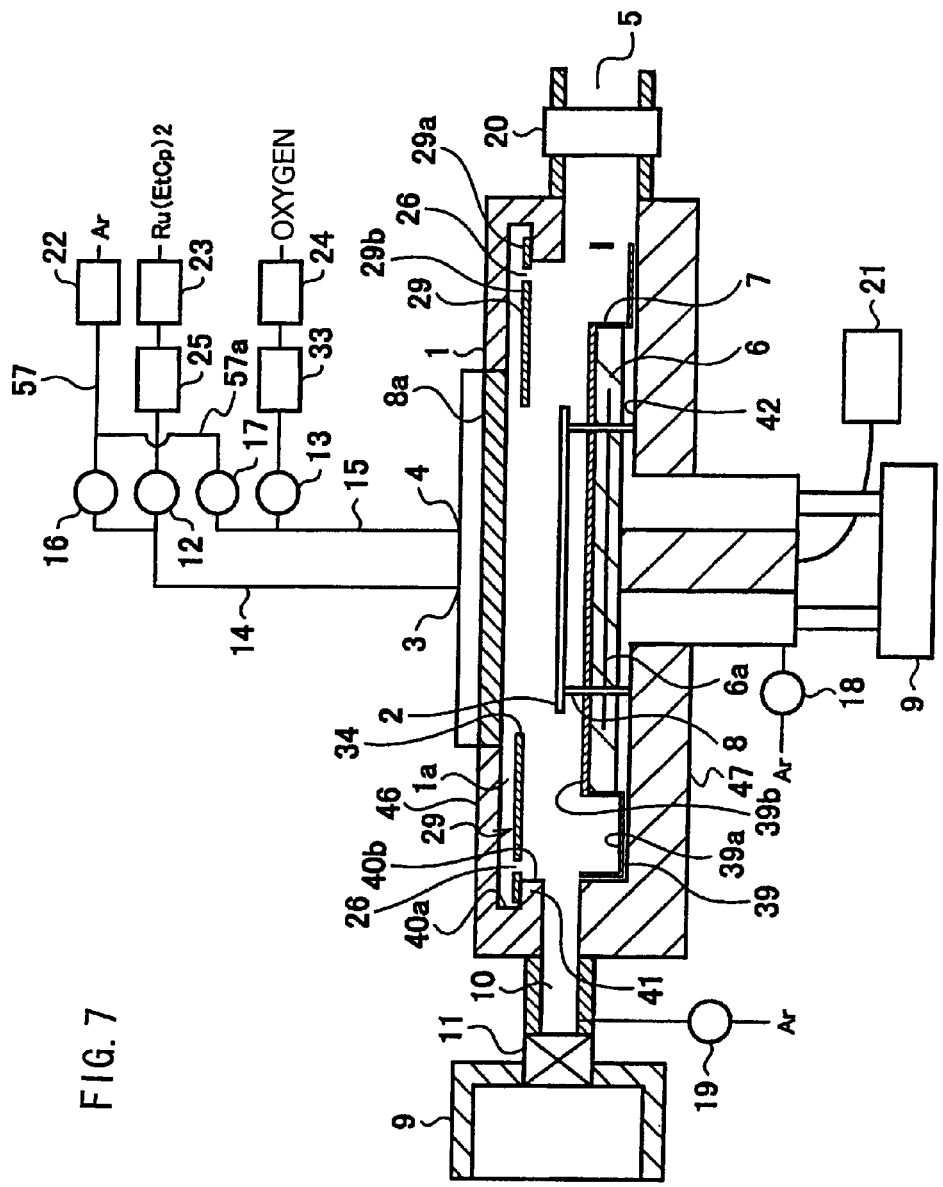
FIG. 7 is a vertical sectional view at the time of carry-in/carry-out of the substrate for explaining the substrate processing apparatus according to a second embodiment.
Figure 8:
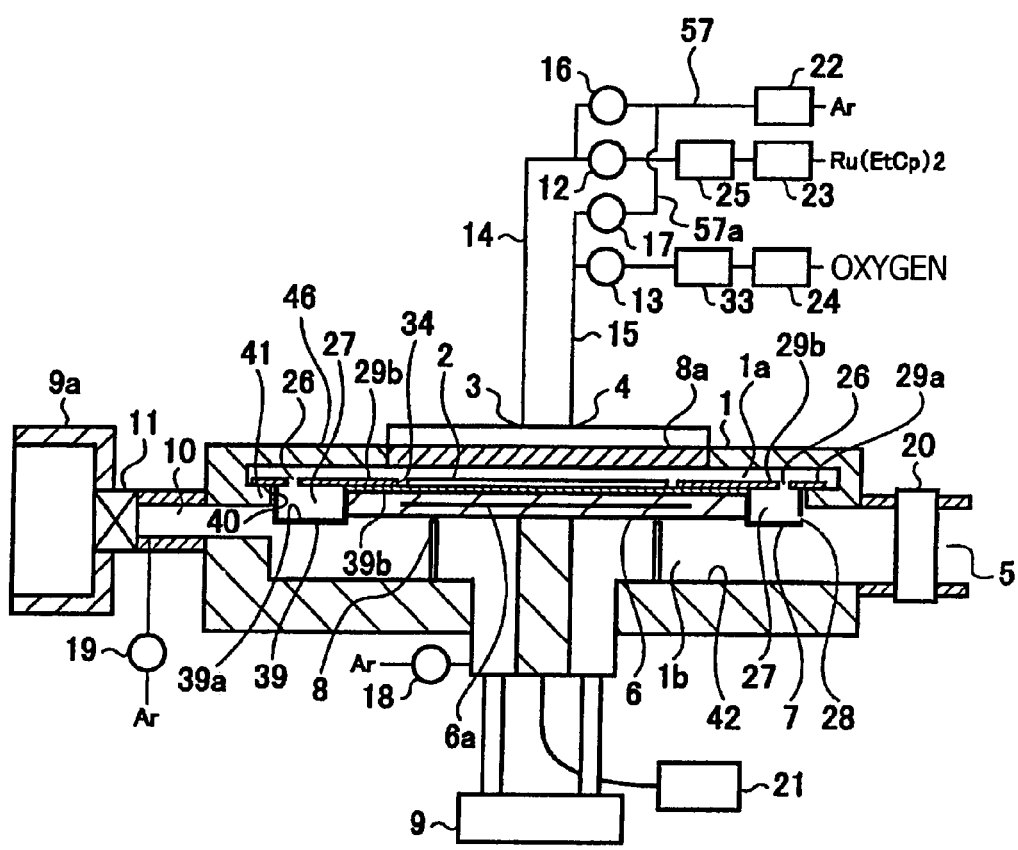
FIG. 8 is a vertical sectional view at the time of film deposition for explaining the substrate processing apparatus according to the second embodiment.
Figure 9:
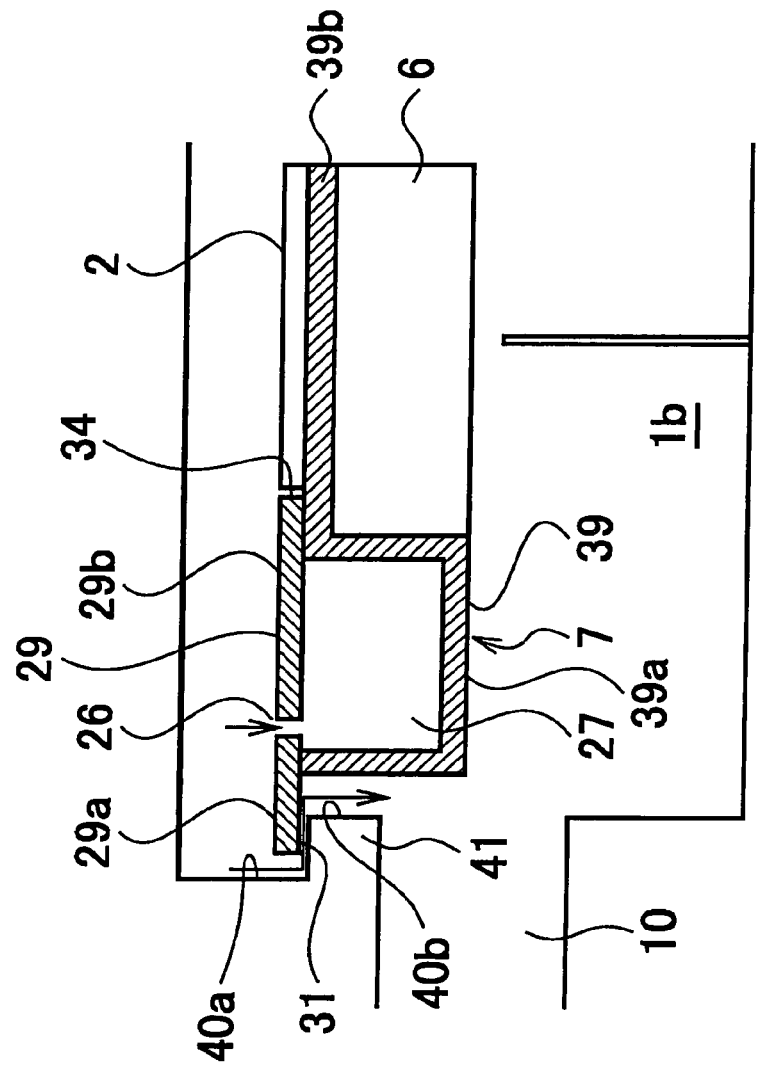
FIG. 9 is an expanded view of an essential part of FIG. 8.
Figure 10:
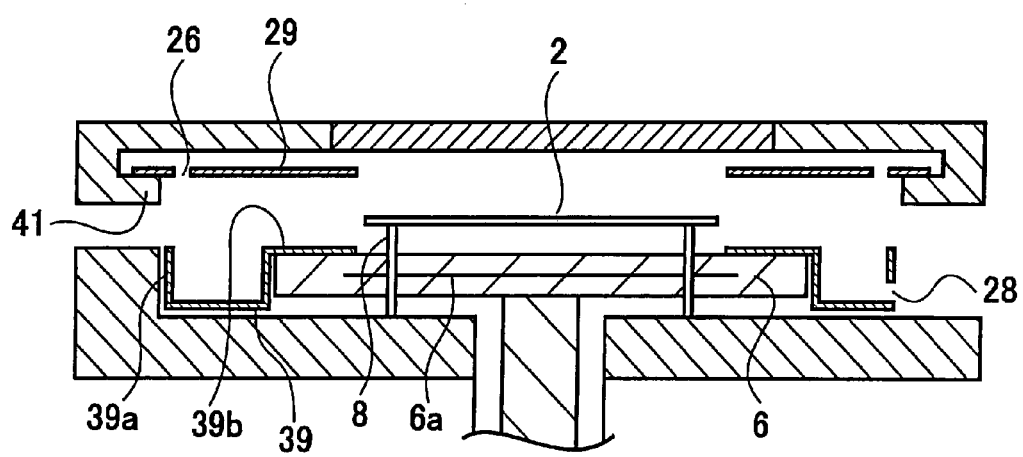
FIG. 10 is an explanatory view showing the modified example of the substrate processing apparatus according to the second embodiment, (a) is a sectional view at the time of carry-in/carry-out of the substrate, and (b) is a sectional view at the time of processing the substrate.
Figure 10:
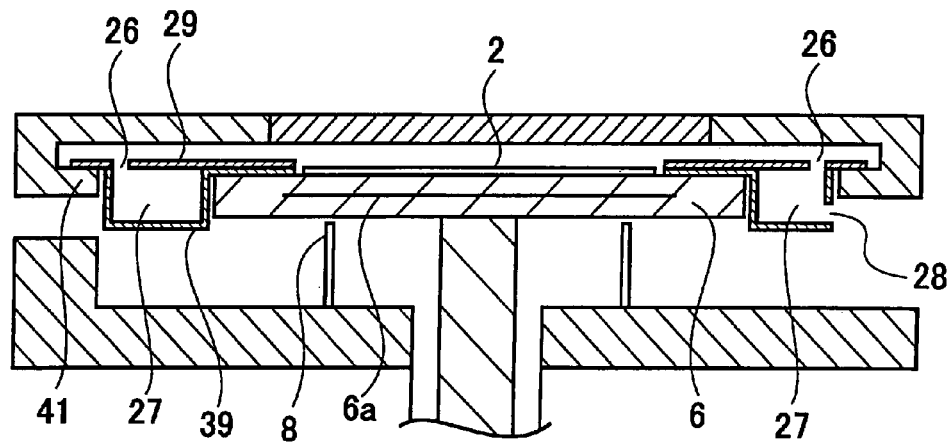
Figure 11:
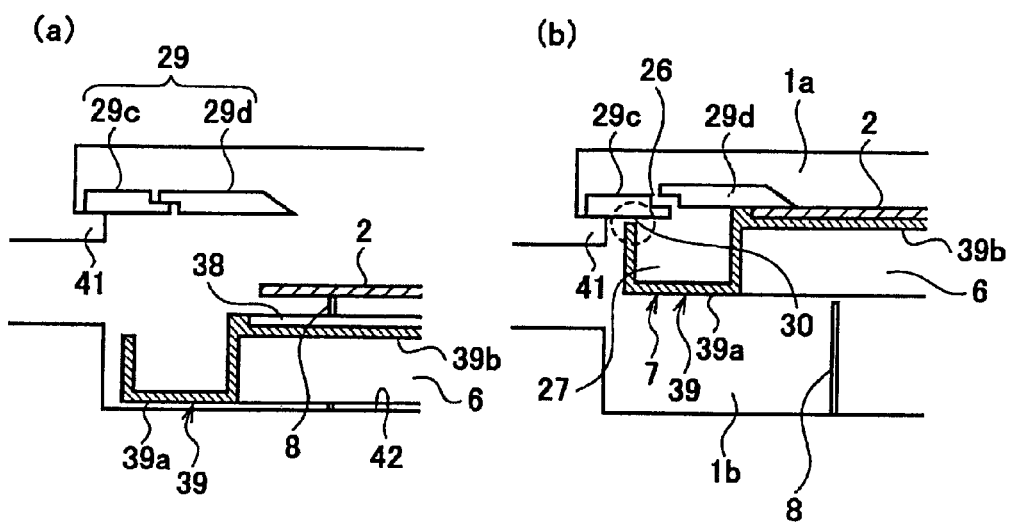
FIG. 11 is an explanatory view of the substrate processing apparatus according to a third embodiment, (a) is a sectional view of an essential part at the time of carry-in/carry-out of the substrate, and (b) is a sectional view of the essential part at the time of processing the substrate.
Figure 12:
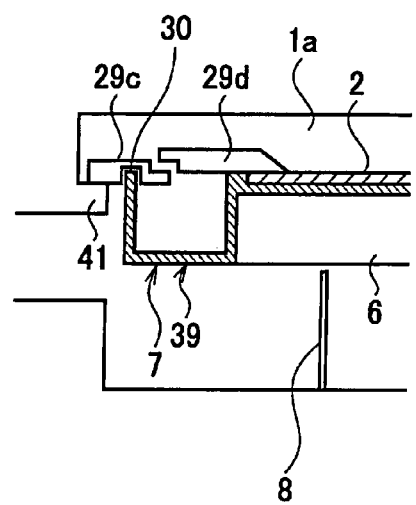
FIG. 12 is a sectional view of the essential part at the time of processing the substrate, showing the modified example of the substrate processing apparatus according to the third embodiment.
Figure 13:
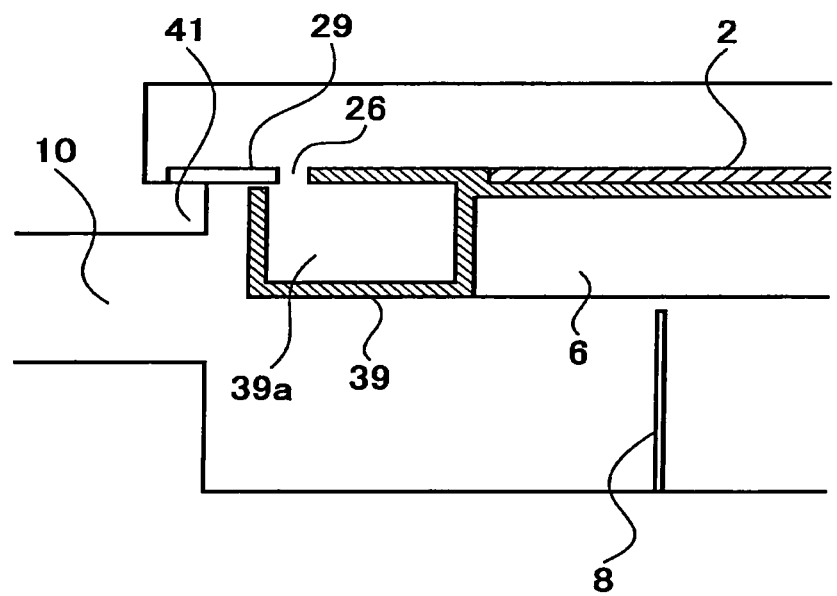
FIG. 13 is an explanatory view showing the modified example of the substrate processing apparatus according to the third embodiment, (a) is a sectional view of the essential part of an example in which a second plate is composed of only an outside plate part and (b) is a sectional view of the essential part of an example in which the second plate is composed of only the outside plate part and constitutes a part of a recessed part of a first plate.
Figure 13:
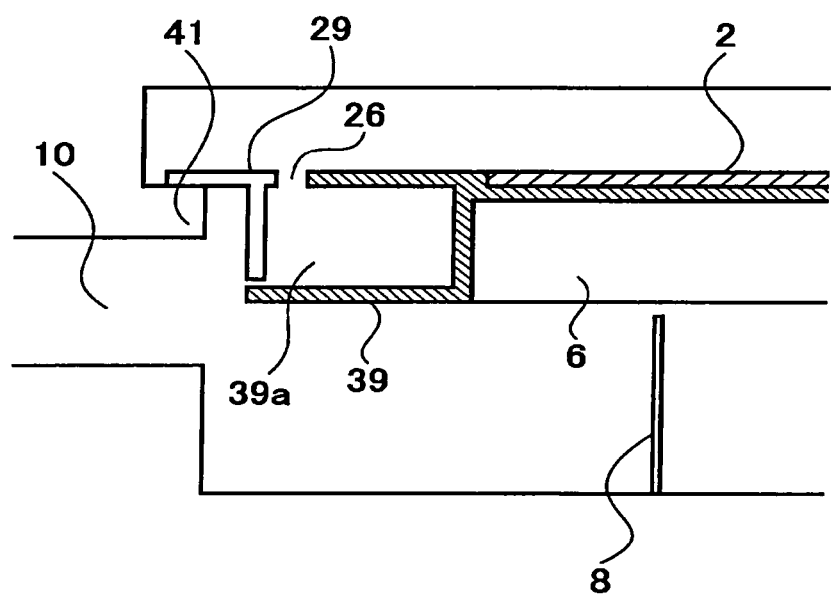
Figure 14:
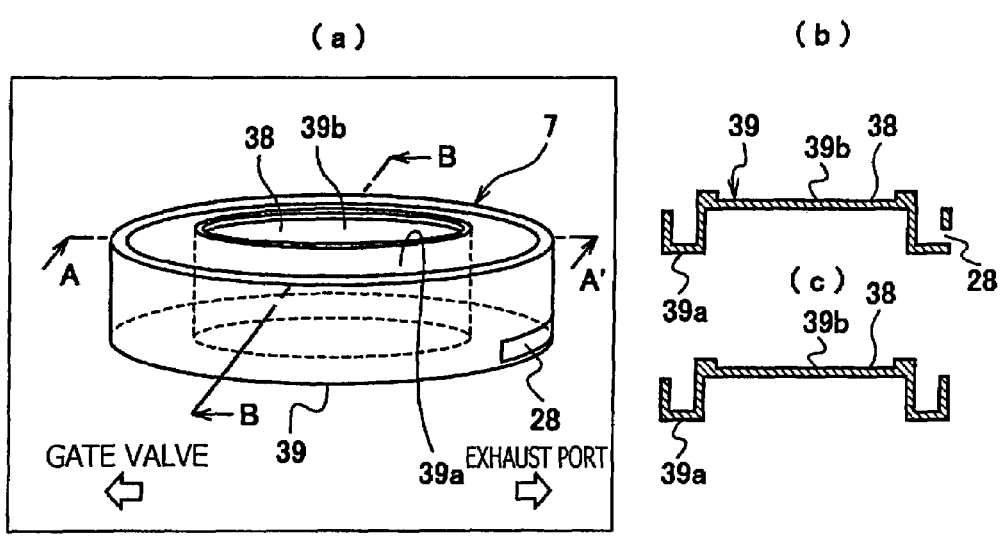
FIG. 14 is an explanatory view of the first plate according to the third embodiment, (a) is a perspective view, (b) is a sectional view taken along the line A-A', and (c) is a sectional view taken along the line B-B.
Figure 15:
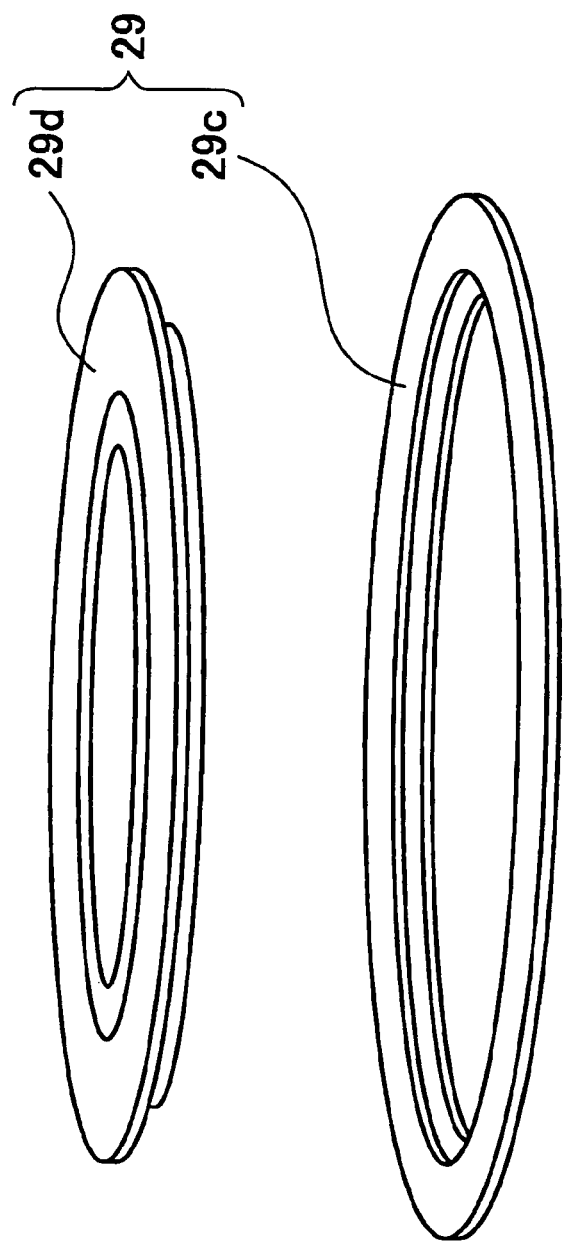
FIG. 15 is an explanatory view of the second plate according to the third embodiment, showing a state that the outside plate and the inside plate are separated from each other.
Figure 16:
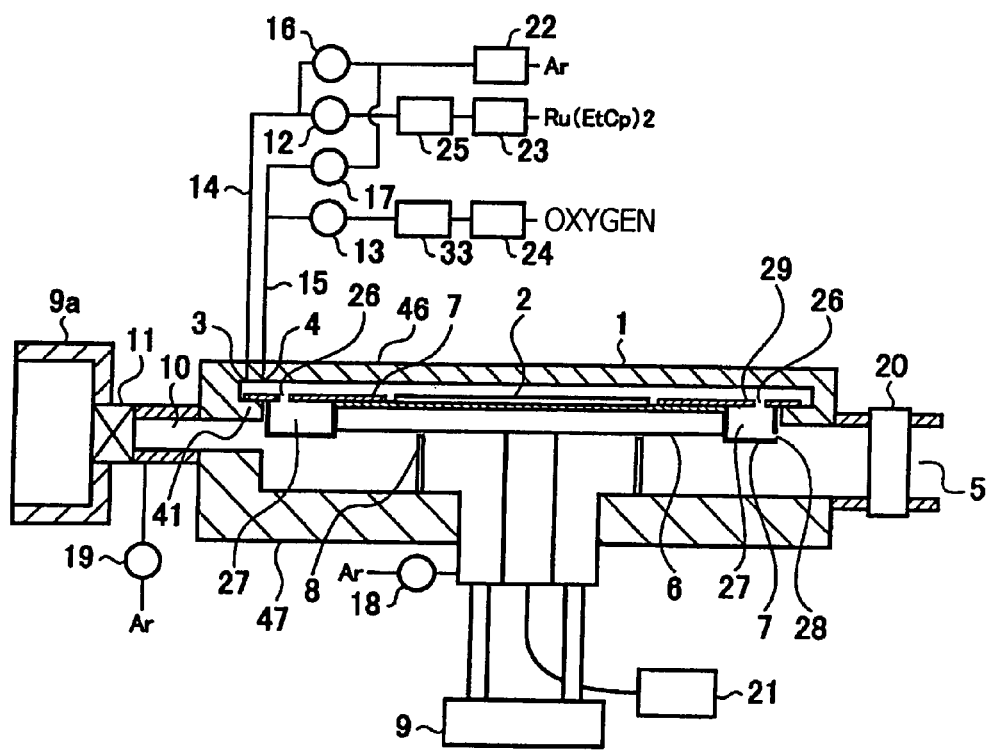
FIG. 16 is a vertical sectional view at the time of processing the substrate, for explaining the substrate processing apparatus showing another embodiment of a gas supplying method according to a fourth embodiment.
Figure 17:
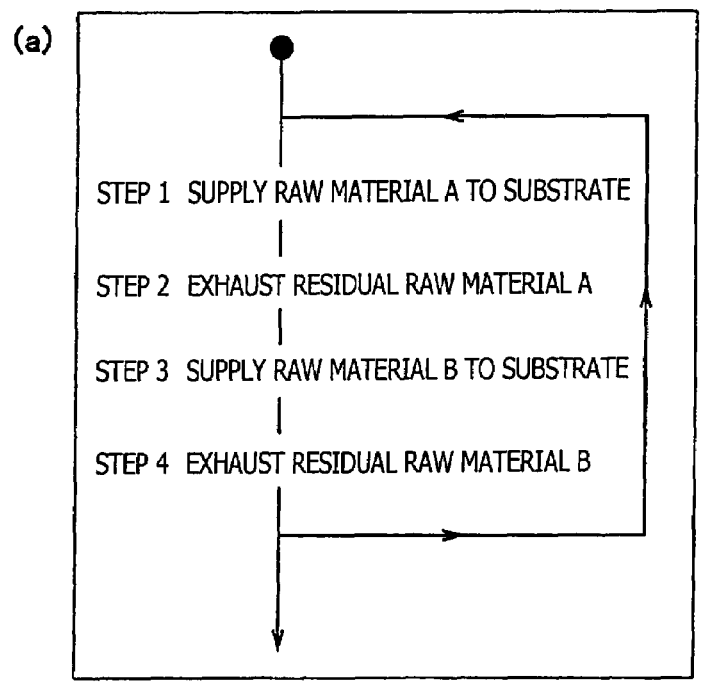
FIG. 17 is an explanatory view showing a basic gas supplying method common in an ALD, being a film deposition method, and a MOCVD, in which a cycle-method is applied, (a) is a flowchart, and (b) is a view of a gas supplying timing.
Figure 17:
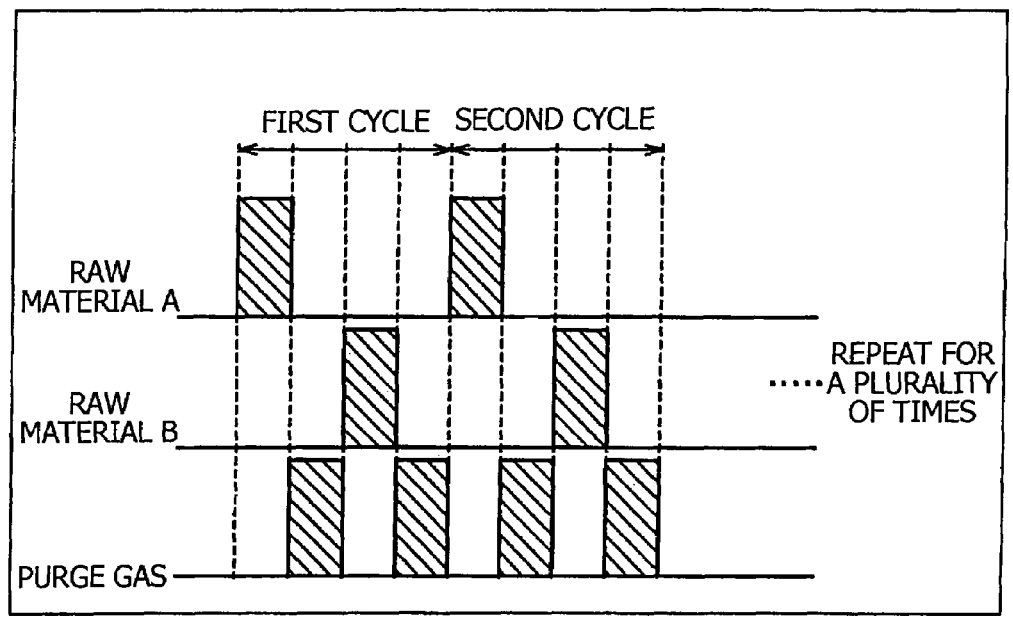

1 Processing chamber
2 Substrate
3.4 Supply port
5 Exhaust port
6 Susceptor
9 Lifting/lowering mechanism
10 Substrate carrying port
35 Exhaust duct
40 Processing chamber side wall

The invention claimed is:

1. A substrate processing apparatus comprising:
a processing chamber for processing a substrate;
a substrate carrying port provided on a sidewall of said processing chamber, for carrying-in/carrying-out said substrate to/from said processing chamber;
a holder provided so as to be lifted and lowered in said processing chamber, for holding said substrate;
a supply port provided above said holder, for supplying gas into said processing chamber;
an exhaust duct provided on the peripheral part of said holder, for exhausting the gas supplied into said processing chamber; and
an exhaust port provided below an upper surface of said exhaust duct when the substrate is processed, for exhausting the gas discharged by said exhaust duct outside said processing chamber,
wherein said exhaust duct is constituted by a plate having a hollow part that communicates with said processing chamber, and a part of said plate is placed on said holder so as to cover at least a part of an upper surface of said holder.

2. The substrate processing apparatus according to claim 1, wherein said hollow part is provided between the sidewall of said processing chamber and a sidewall of said holder.

3. The substrate processing apparatus according to claim 1, further comprising a controller for controlling to supply two kinds or more of reactive gases alternately for a plurality of times from said supply port, and interpose a supply of purge gas between alternate supplies of said two kinds of more of reactive gases.

4. A substrate processing apparatus, comprising:
a processing chamber for processing a substrate;
a substrate carrying port provided on a sidewall of said processing chamber, for carrying-in/carrying-out said substrate to/from said processing chamber;
a holder provided so as to be lifted and lowered in said processing chamber, for holding said substrate;
a supply port provided above said holder, for supplying gas into said processing chamber;
an exhaust duct provided on the peripheral part of said holder, for exhausting the gas supplied into said processing chamber; and
an exhaust port provided below an upper surface of said exhaust duct when the substrate is processed, for exhausting the gas discharged by said exhaust duct outside said processing chamber,
wherein said exhaust duct is constituted by a plate having a hollow part that communicates with said processing chamber, and said plate is composed of a first plate having a recessed part and being provided so as to be lifted and lowered and a second plate covering said recessed part, and they are separately provided.

5. The substrate processing apparatus according to claim 4, wherein said second plate is held at a substrate processing position.

6. The substrate processing apparatus according to claim 4, further comprising a controller for controlling to supply two kinds or more of reactive gases alternately for a plurality of times from said supply port, and interpose a supply of purge gas between alternate supplies of said two kinds or more of reactive gases.

7. The substrate processing apparatus according to claim 4, wherein said second plate has an inside plate and an outside plate, and said inside plate is placed on said outside plate.

8. The substrate processing apparatus according to claim 7, wherein only said inside plate is brought into contact with said first plate, and said outside plate is not brought into contact with said first plate, in a state of moving said substrate to a substrate processing position.

9. The substrate processing apparatus according to claim 8, wherein a discharge port for discharging the gas into said hollow part of said plate from said processing chamber is formed by a gap formed between said inside plate and said outside plate in a state of moving said substrate to said substrate processing position.

10. A method of manufacturing a semiconductor device, comprising:
carrying a substrate into a processing chamber;
placing said substrate carried into said processing chamber on a holder by lifting said holder;
processing said substrate by discharging gas by an exhaust duct provided on the peripheral part of said holder while supplying the gas to said substrate placed on said holder, and exhausting the gas discharged by said exhaust duct, outside said processing chamber from an exhaust port provided below an upper surface of said exhaust duct;

setting said substrate after processing possible to be carried out by lowering said holder; and carrying out said substrate after processing from said processing chamber, wherein said exhaust duct is constituted by a plate having a hollow part that communicates with said processing chamber, and a part of said plate is placed on said holder so as to cover at least a part of an upper surface of said holder; and wherein in the step of lifting and lowering said holder, at least a part of said plate constituting said exhaust duct is lifted and lowered together with said holder.

11. The method of manufacturing the semiconductor device according to claim 10, wherein in the step of processing the substrate, two kinds or more of reactive gases are alternately supplied to said substrate for a plurality of times, and supply of purge gas is interposed between the alternate supplies of said two kinds or more of the reactive gases.

12. A method of manufacturing a semiconductor device, comprising:

carrying a substrate into a processing chamber;

placing said substrate carried into said processing chamber on a holder by lifting said holder;

processing said substrate by discharging gas by an exhaust duct provided on the peripheral part of said holder while supplying the gas to said substrate placed on said holder, and exhausting the gas discharged by said exhaust duct outside said processing chamber from an exhaust port provided below an upper surface of said exhaust duct;

setting said substrate after processing possible to be carried out by lowering said holder; and carrying out said substrate after processing from said processing chamber, wherein said exhaust duct is constituted by a plate having a hollow part that communicates with said processing chamber and said plate is composed of a first plate having a recessed part and a second plate covering said recessed part, and they are separately provided; and wherein in the step of lifting and lowering said holder, said first plate is lifted and lowered together with said holder.

13. The method of manufacturing the semiconductor device according to claim 12, wherein in the step of processing the substrate, two kinds or more of reactive gases are alternately supplied to said substrate for a plurality of times, and supply of purge gas is interposed between the alternate supplies of said two kinds or more of the reactive gases.

* * * * *